United States Patent
Chua et al.

(10) Patent No.: US 6,674,090 B1
(45) Date of Patent: *Jan. 6, 2004

(54) STRUCTURE AND METHOD FOR PLANAR LATERAL OXIDATION IN ACTIVE

(75) Inventors: Christopher L. Chua, San Jose, CA (US); Philip D. Floyd, Sunnyvale, CA (US); Thomas L. Paoli, Los Altos, CA (US); Decai Sun, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/472,754

(22) Filed: Dec. 27, 1999

(51) Int. Cl.[7] .............................. H01L 29/06; H01S 3/19
(52) U.S. Cl. .............................. 257/13; 257/12; 257/35; 372/46

(58) Field of Search .............................. 257/12, 13, 35; 372/45, 46

(56) References Cited

U.S. PATENT DOCUMENTS 5,719,891 A * 2/1998 Jewell .......................... 372/45
5,896,408 A * 4/1999 Corzine et al. ................ 372/46
5,978,408 A * 11/1999 Thornton ....................... 372/96

FOREIGN PATENT DOCUMENTS

JP  11-40747  * 2/1999 ........... H01L/27/04

* cited by examiner

*Primary Examiner*—Ori Nadav

(57) ABSTRACT

An active semiconductor device is made using planar lateral oxidation to define a core region that is surrounded by regions of buried oxidized semiconductor material in. The buried oxidized semiconductor material provides optical waveguiding, and or a defined electrical path.

11 Claims, 25 Drawing Sheets

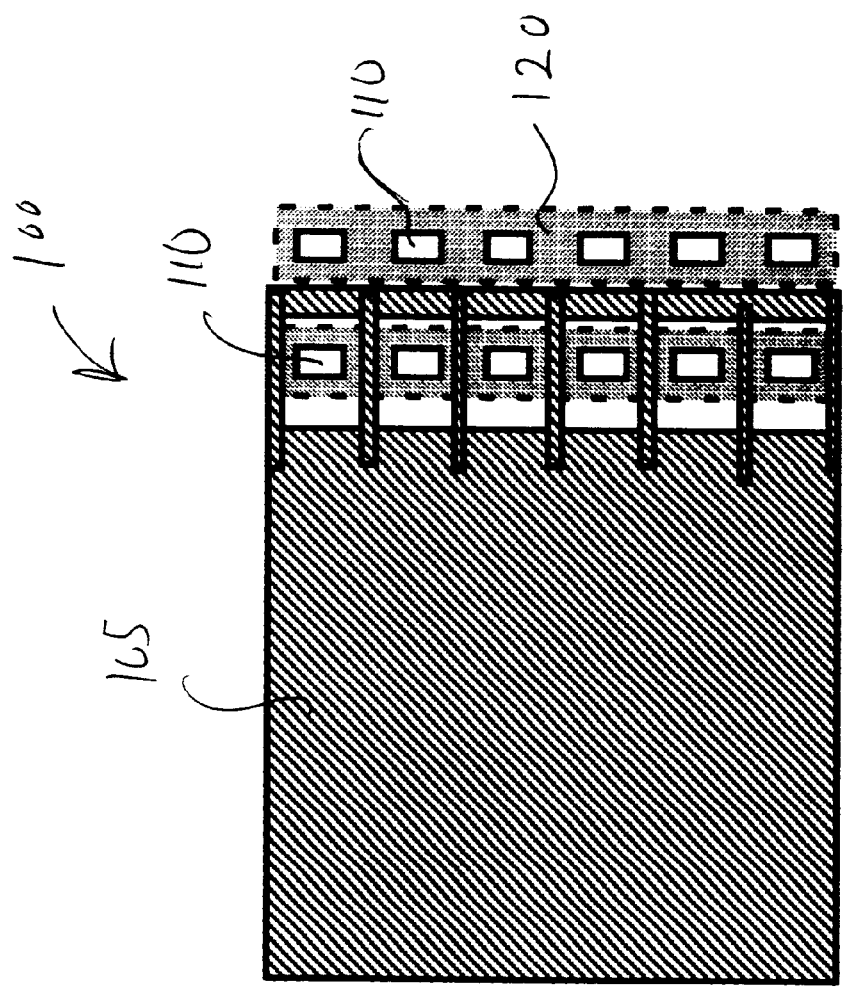

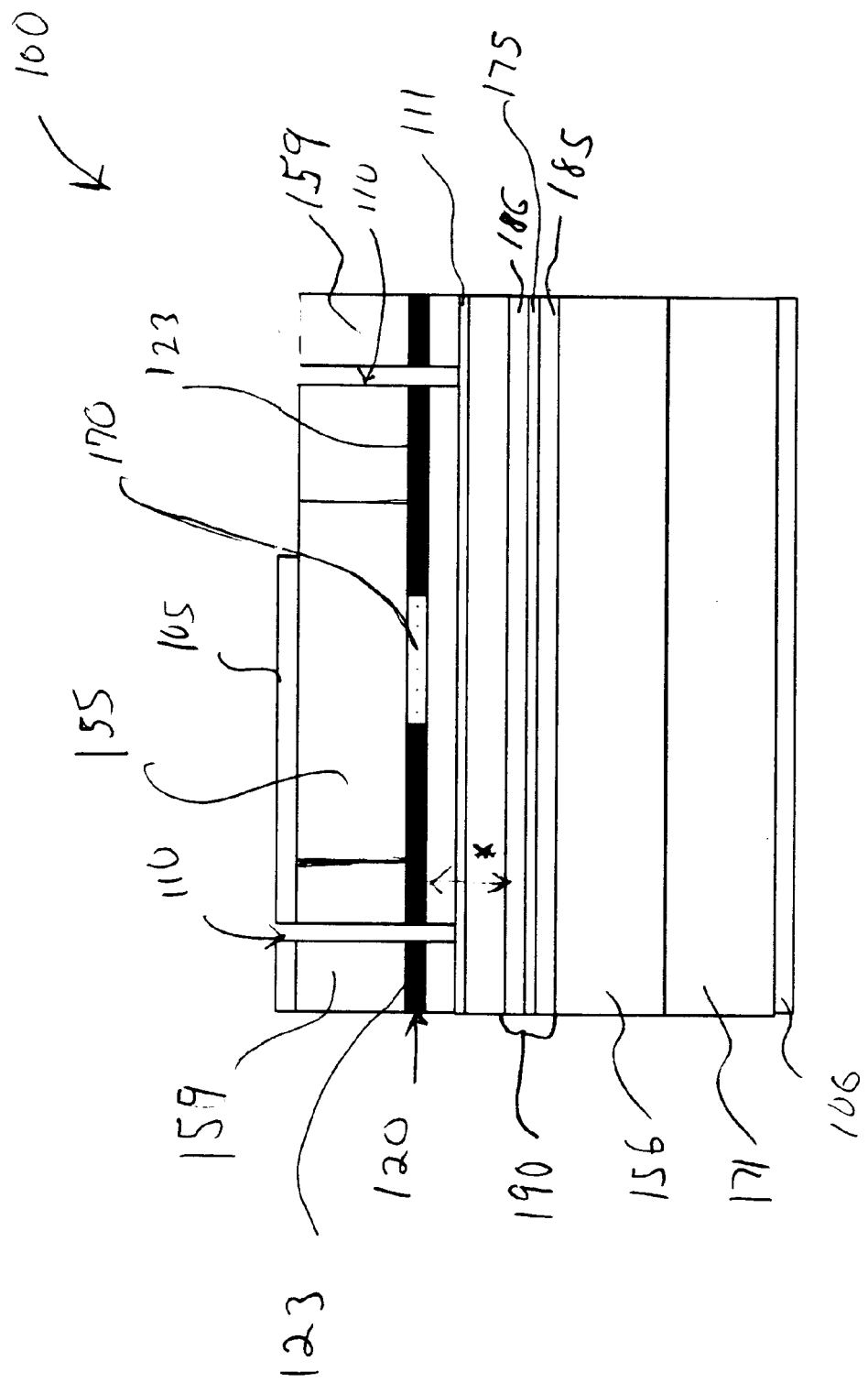

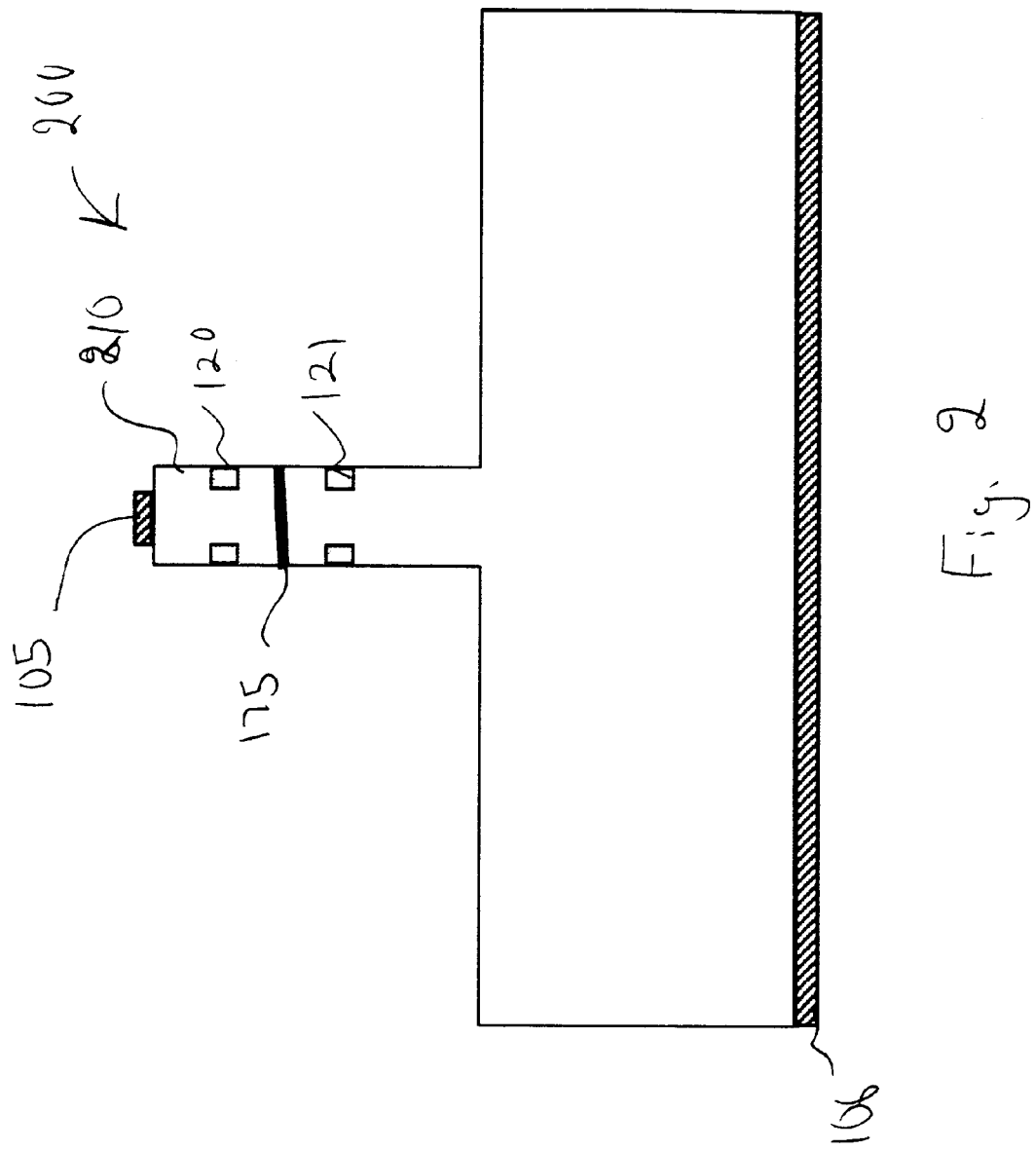

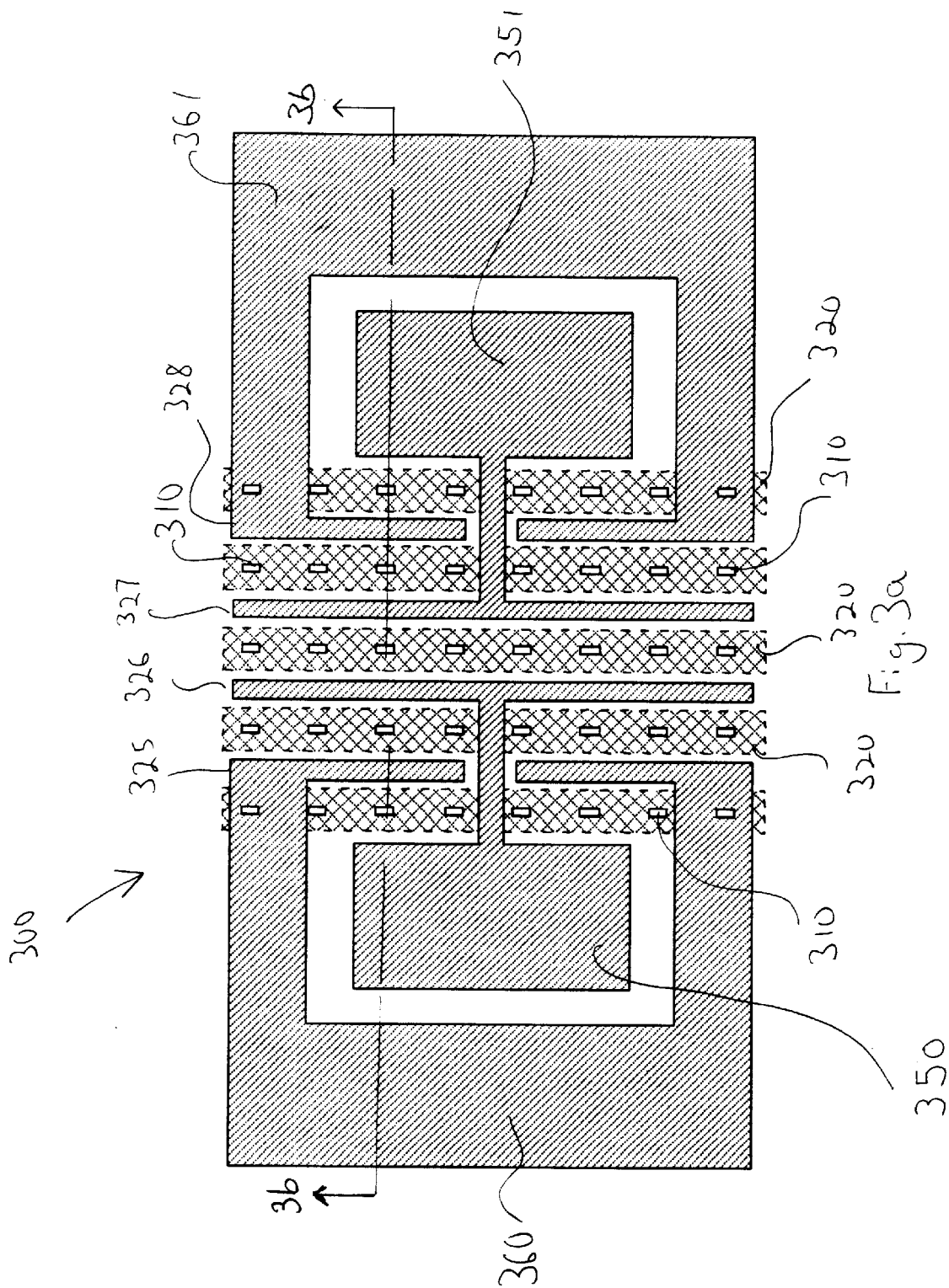

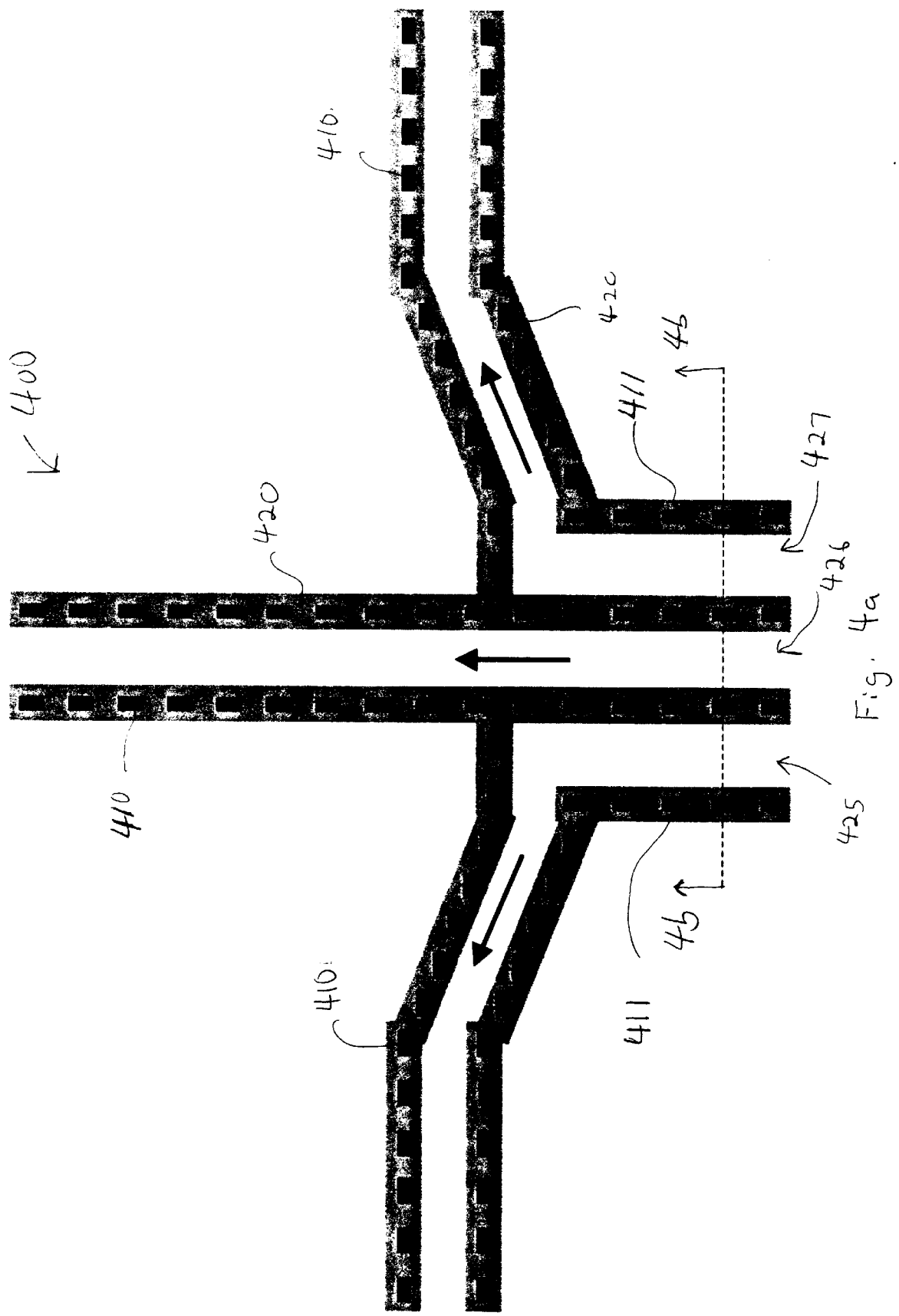

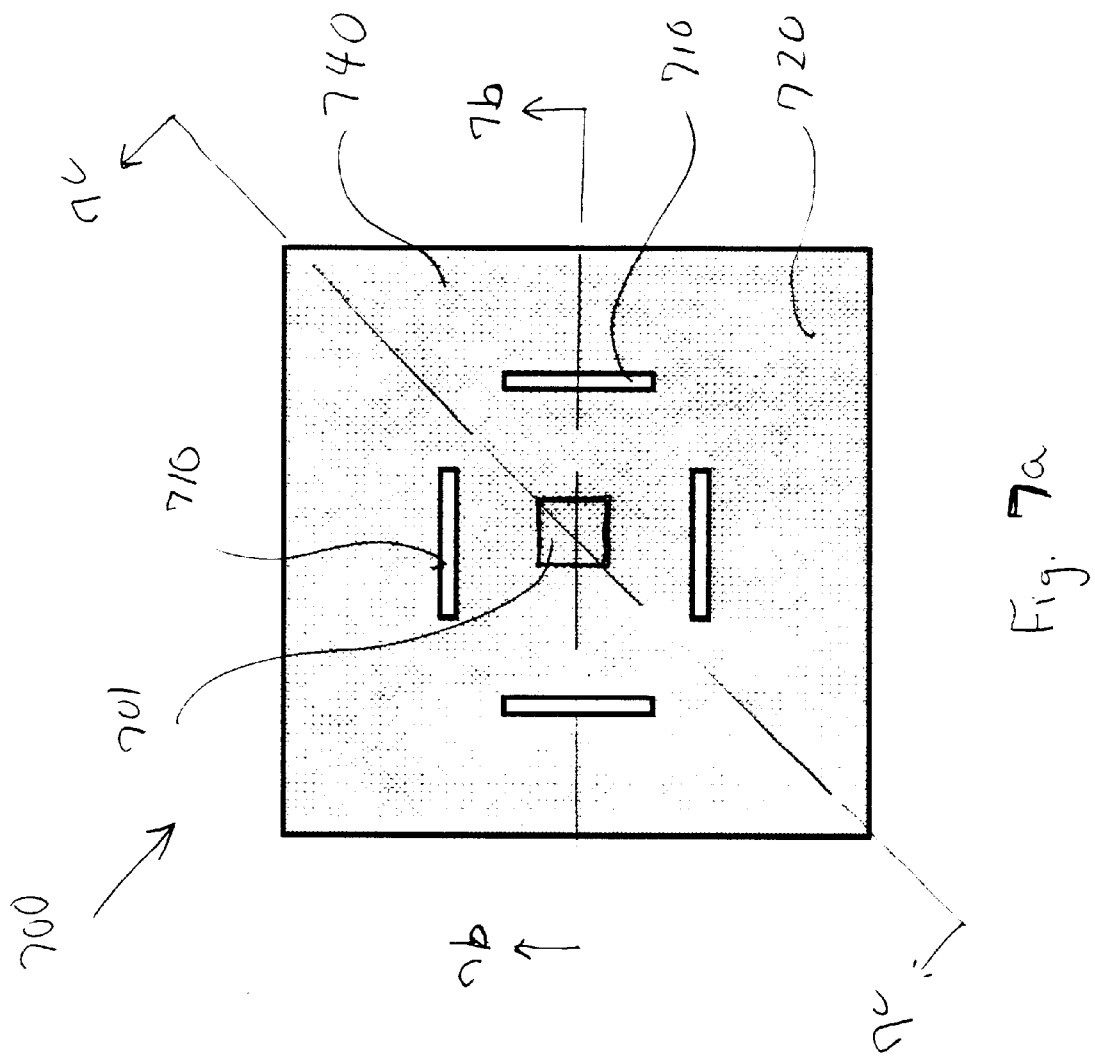

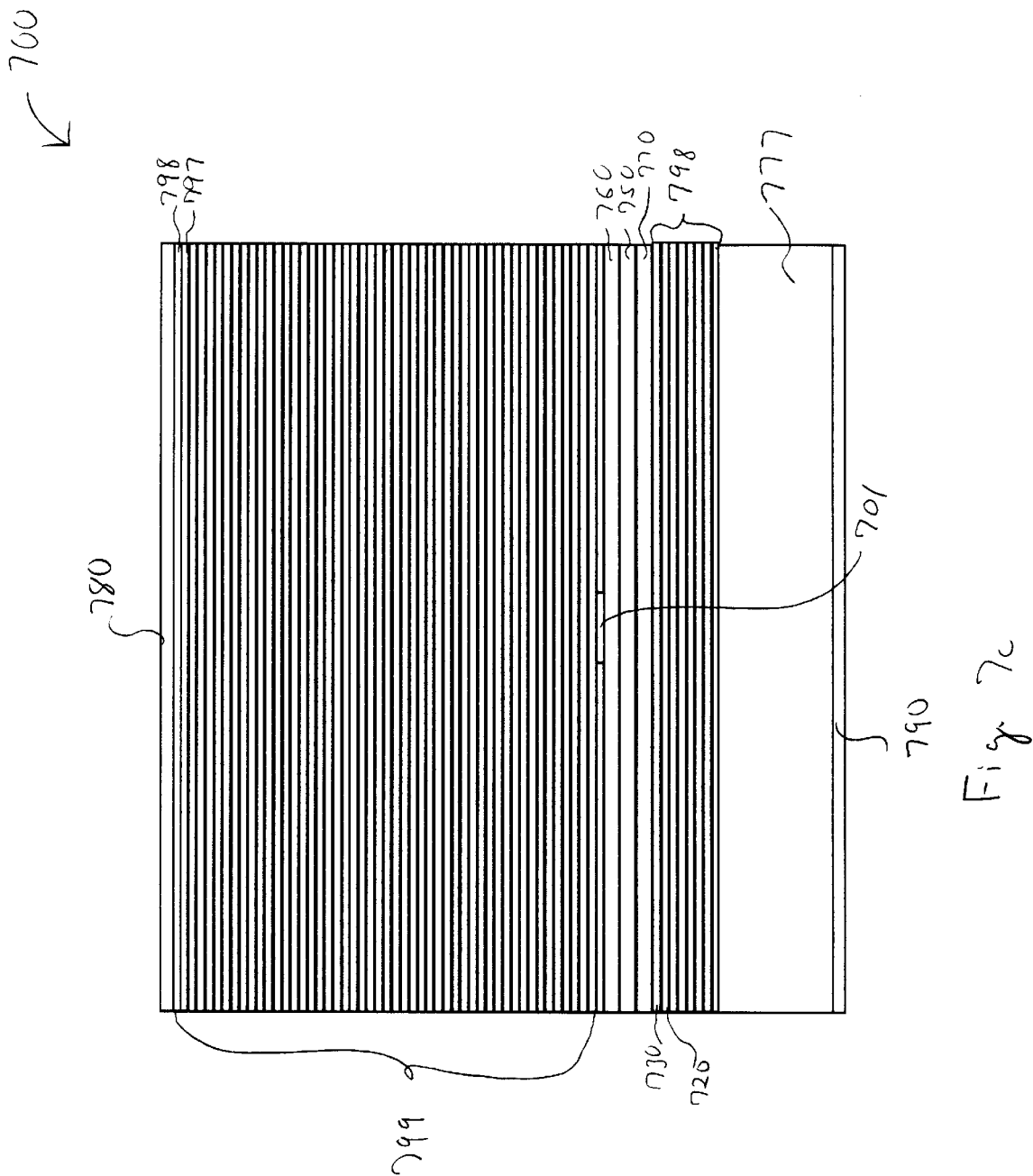

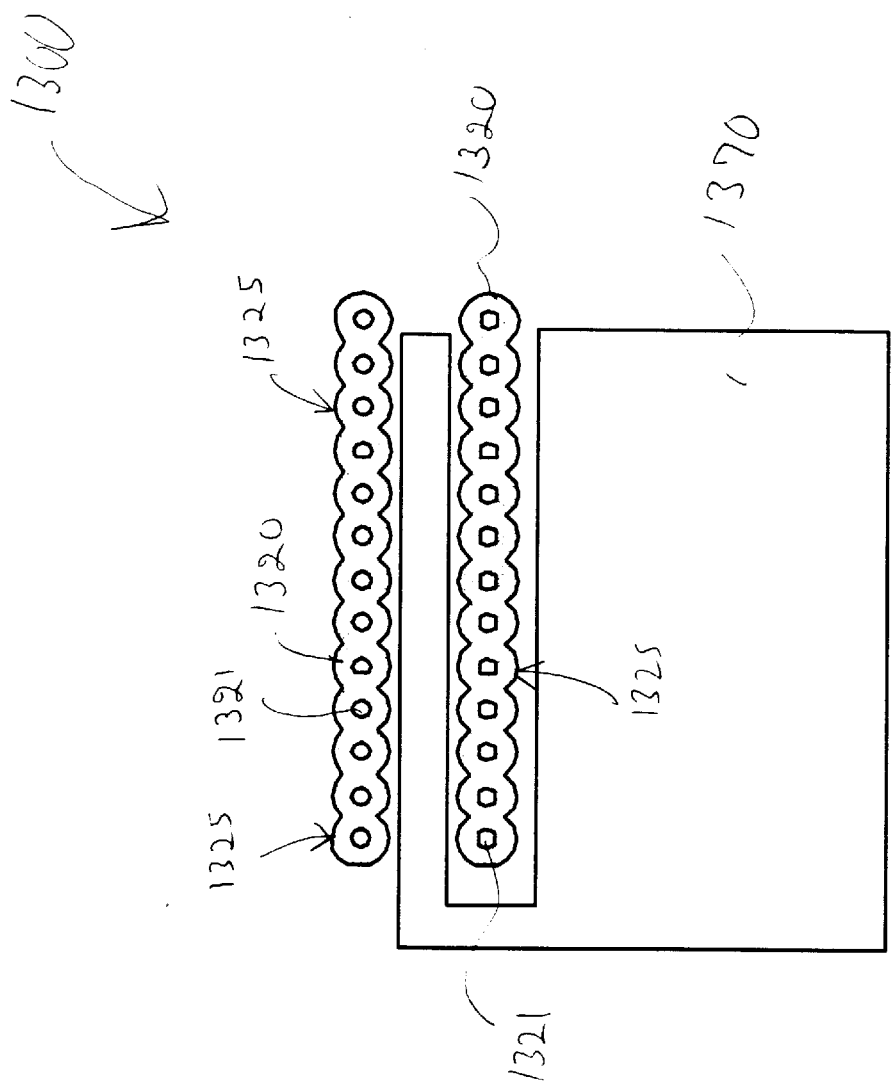

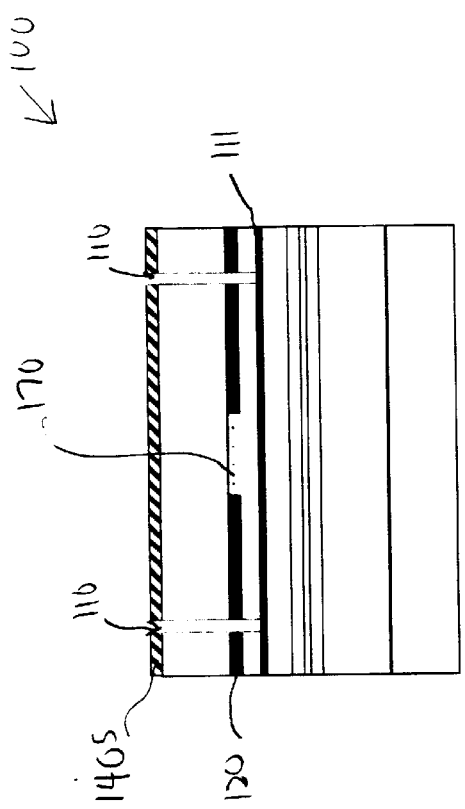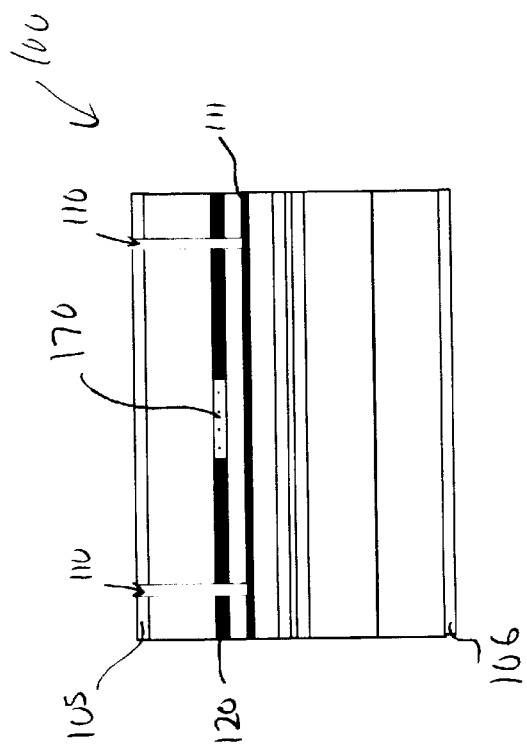

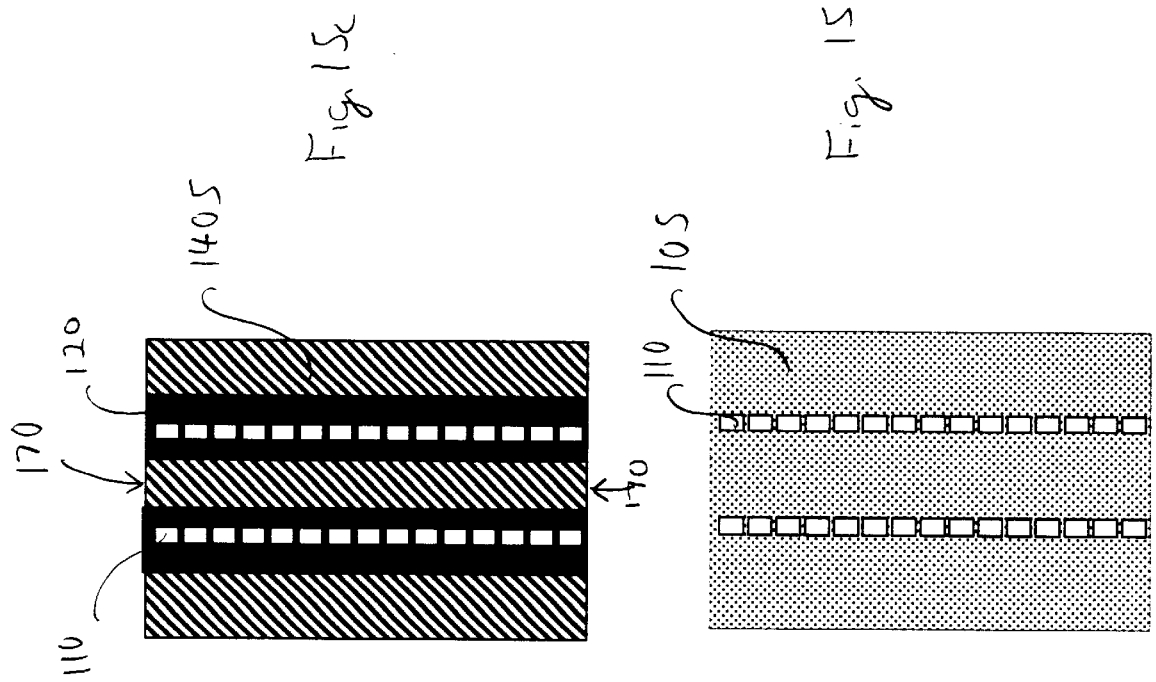

US 6,674,090 B1

STRUCTURE AND METHOD FOR PLANAR LATERAL OXIDATION IN ACTIVE

BACKGROUND OF INVENTION

In a variety of semiconductor applications it is desirable to access buried semiconductor layers in order to oxidize the buried layer. Numerous photonic, electronic and micromechanical devices require a region of buried material that is electrically insulating or differs from surrounding material by having a lower refractive index. Such a material can be formed during device fabrication by selectively converting one or more buried semiconductor layers into an electrically insulating low refractive index native oxide.

An oxidized region may be made to partially or completely surround a region of interest to produce a desired optical effect due to the lower refractive index of the oxide region. Buried oxide layers may also function to electrically isolate different regions of a device or to electrically isolate one device from another on the same wafer. The buried layer material may be any material that oxidizes rapidly in a lateral direction and is typically a semiconductor having a high aluminum content such as AlGaAs, AlGaInP or AlAsSb. The buried layer may be, but is not limited to compounds containing aluminum and one or more of the following elements: As, Ga, In, P and Sb. Aluminum will typically comprise at least 70% of the Group III component of the compound. Exposure to an oxidizing environment such as steam at elevated temperature the buried layer would oxidize laterally, proceeding from exposed sidewalls inward towards unoxidized portions of the material. The lateral oxidation rate generally increases with increasing aluminum content.

The usual method of accessing the buried oxidation layers is through a mesa etch. This method leads to a high level of wafer non-planarity that complicates subsequent processing steps. Moreover, the large amount of materials removed degrade the device's mechanical integrity and increases its thermal resistance. The problem is especially severe in devices like vertical-cavity surface-emitting lasers, where the oxidation layer is usually embedded far beneath the wafer surface.

SUMMARY OF INVENTION

Instead of forming mesas that expose the sidewalls of the layers to be oxidized, a plurality of etched cavities may be used to access the buried layer for oxidation. The shape and size of the resulting oxidized region are defined by the shape of each cavity and by placement of the cavities with respect to each other. The area between cavities remains planar, which eases further processing steps such as electrical contact formation and photolithography. Planar structures allow for simple etch, deposition, photolithography steps without concern for depth of focus issues during photolithography or problems with step coverage during deposition or spin coating of dielectric and or polymer films. The materials between etched cavities remain intact, so good mechanical integrity and thermal conductivity can be maintained.

Planar lateral oxidation benefits a number of applications. Applications include but are not limited to applications containing a core region that is surrounded by buried oxidized materials, where the oxidized materials provide optical waveguiding, a defined electrical conduction path, or both; applications where one or more completely oxidized layers are used for their optical filtering properties; applications that employ the oxidized layers for electrical isolation; and applications where properties are controlled by the shape of the oxidized region.

BRIEF DESCRIPTION OF THE DRAWINGS

FIG. 1a shows a top view of an embodiment in accordance with the invention.

FIG. 1b shows a cross-sectional view of the embodiment in FIG. 1a in accordance with the invention.

FIG. 2 shows a mesa structure edge emitting semiconductor laser.

FIG. 3a shows a top view of an embodiment in accordance with the invention.

FIG. 4a shows a top view of an embodiment in accordance with the invention.

FIG. 4b shows a cross-sectional view of the embodiment in FIG. 4a in accordance with the invention.

FIG. 7a shows a top view of an embodiment in accordance with the invention.

FIG. 7c shows a cross-sectional view of the embodiment in FIG. 7a in accordance with the invention.

FIG. 11b shows a top view of an embodiment in accordance with the invention.

FIG. 13a shows a top view of an embodiment in accordance with the invention.

FIGS. 14a–14d show a side view of steps for making an embodiment in accordance with the invention.

FIG. 15a–15d show a top view of the steps in FIGS. 14a–14d, respectively.

DETAILED DESCRIPTION

Figure 1C:
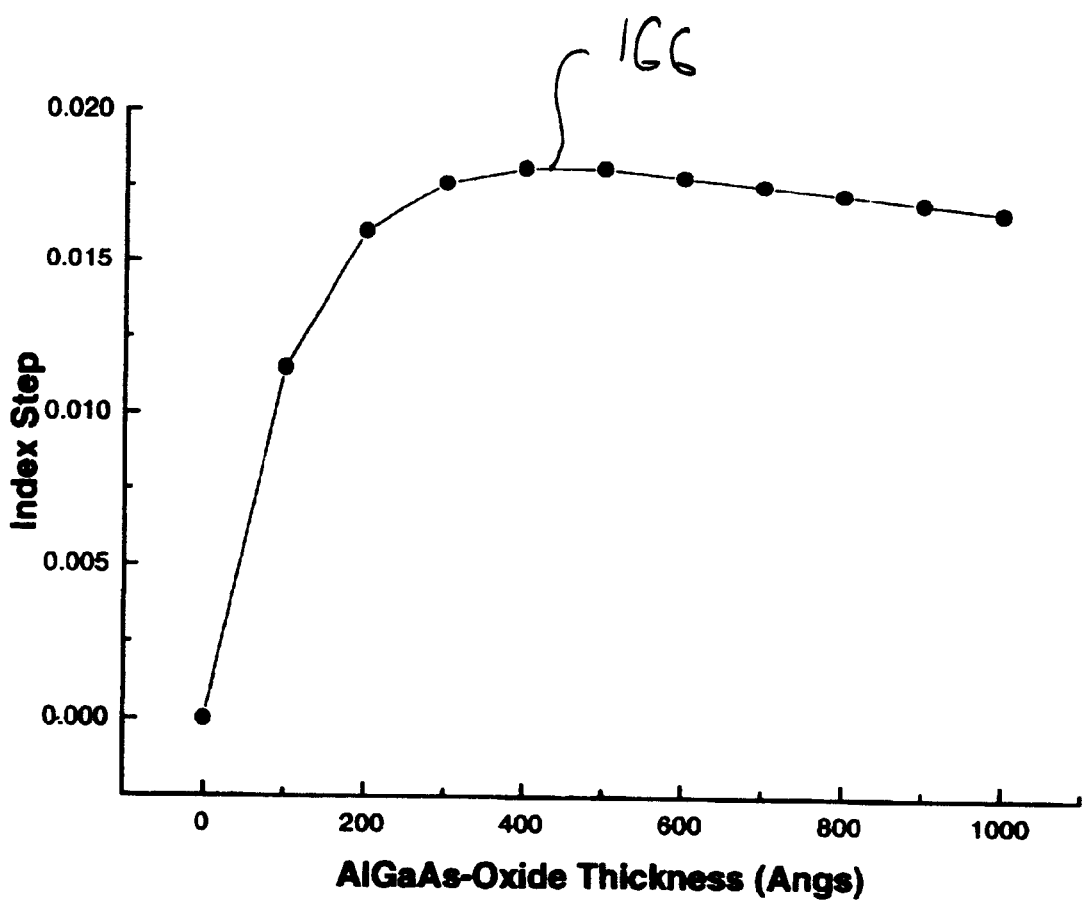
FIG. 1c shows variation of the lateral index of refraction step as a function of oxide layer thickness for an embodiment in accordance with the invention.

An embodiment in accordance with the invention, edge emitting laser structure 100 is shown in FIG. 1a in top view and in FIG. 1b in cross section. $Ga_{0.4}In_{0.6}P$ quantum well active layer 175, typically about 80Å thick, is bordered by p-type $(Al_{0.6}Ga_{0.4})_{0.5}In_{0.5}P$ barrier layer 186 and by n-type $(Al_{0.6}Ga_{0.4})_{0.5}In_{0.5}P$ barrier layer 185, both barrier layers 185 and 186 typically being about 0.12 μm thick. Etched cavities 110 allow access to $Al_yGa_{1-y}As$ buried layer 120 for lateral oxidation. The value selected for y is generally greater than 0.95 and a typical value is 0.99. $Al_{0.99}Ga_{0.01}As$ buried layer 120 is typically less than 1000 Å thick. Stripe 170 of $Al_{0.99}Ga_{0.01}As$ buried layer 120 remains unoxidized to provide a lateral index of refraction step while regions 123 are oxidized to define stripe 170. GaInP layer 111 is optional and lies below $Al_{0.99}Ga_{0.01}As$ buried layer 120 and serves as an etch stop for etching of cavities 110. P type $Al_{0.5}In_{0.5}P$ cladding layer 155 overlies $Al_{0.99}Ga_{0.01}As$ buried layer 120 while n type $Al_{0.5}In_{0.5}P$ cladding layer 156 lies below n-type $(Al_{0.6}Ga_{0.4})_{0.5}In_{0.5}P$ barrier layer 185 and above $n^+$ GaAs substrate 171. cladding layer 155 and cladding layer 156 are typically about 1 μm thick. Electrical connections are provided by p-electrode 105 and n-electrode 106. Electrical isolation is achieved by implanting regions 159 using a shallow proton implant.

Figure 1D:
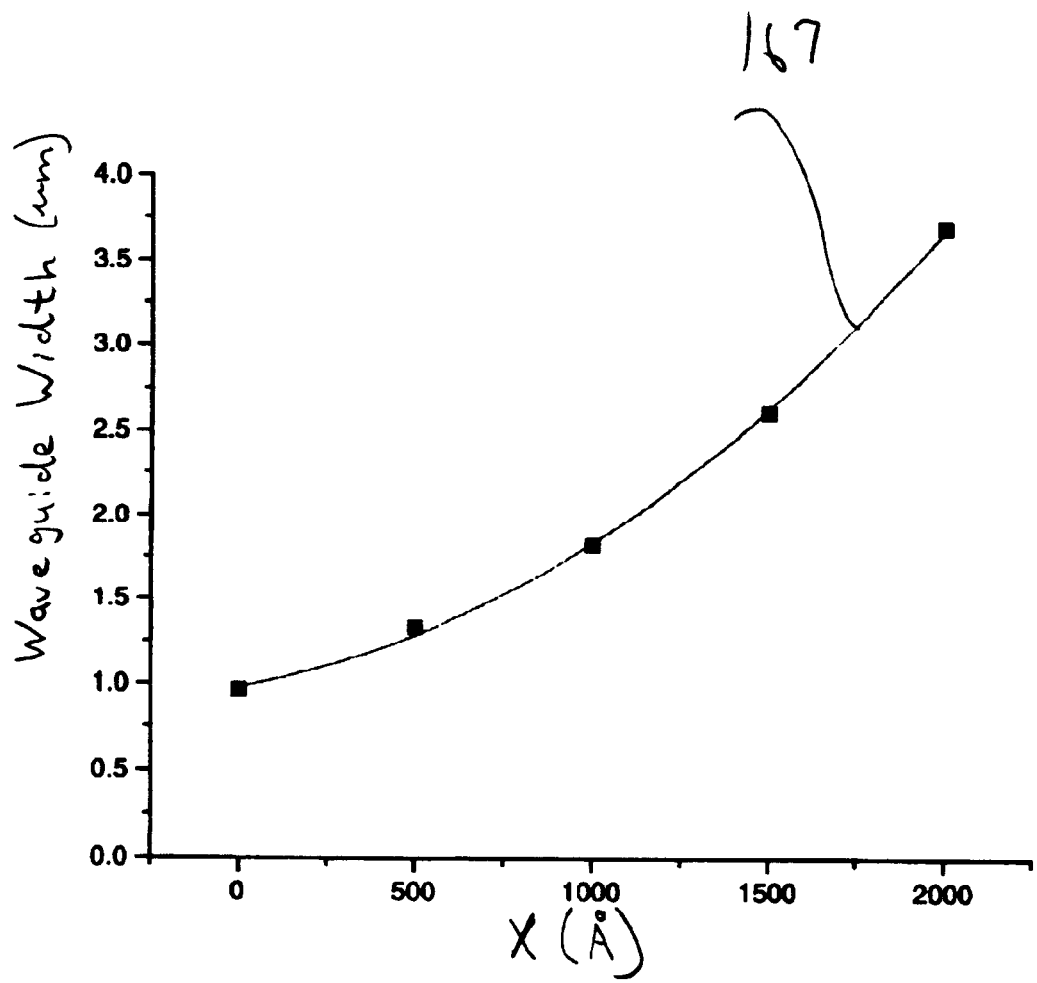
FIG. 1d shows the maximum width of the stripe needed to maintain single mode operation as a function of the spacing between the laterally oxidized layer and the separate confinement heterostructure.

Following oxidation, $Al_{0.99}Ga_{0.01}As$ buried layer 120 provides lateral index guiding for edge-emitting laser structure 100. Edge-emitting laser structure 100 is made single mode by tailoring the thickness and position of $Al_{0.99}Ga_{0.01}As$ buried layer 120 to create an effective lateral index of refraction step to allow only for propagation of the fundamental mode. The lateral index of refraction step is determined by the effective index of refraction of three slab waveguides. Two slab waveguides are defined by the regions lying above and below the oxidized portions of layer 120 while the third waveguide region is defined by the layers lying above and below unoxidized strip region 170. The lateral index of refraction step depends on the thickness of $Al_{0.99}Ga_{0.01}As$ buried layer 120 and the distance, x, of $Al_{0.99}Ga_{0.01}As$ buried layer 120 from separate confinement heterostructure (SCH) 190 which consists of layers 186, 175 and 185. Curve 166 in FIG. 1c shows the dependence of the lateral index of refraction step as a function of the thickness of $Al_{0.99}Ga_{0.01}As$ buried layer 120 in angstroms. FIG. 1d shows the relationship between the maximum width of stripe 170 in microns needed to maintain single mode operation and the distance, x, in angstroms, of $Al_{0.99}Ga_{0.01}As$ buried layer 120 having a thickness of 500 Å, from SCH 190. Points in FIG. 1d lying below curve 167 indicate single mode operation while points above curve 167 indicate multi-mode operation of edge-emitting laser 100.

Because overall wafer planarity is maintained, electrical contacting by metal contact 105 can be readily accomplished without complicated planarization steps. Metal contact 106 at the base of edge-emitting laser 106 serves as the second electrical contact. The embodiment in accordance with the invention shown in FIGS. 1a and 1b differs from edge-emitting laser 300 shown in FIG. 2 where a mesa etch is used to access oxidation layers 120 and 121. The processing steps used to fabricate edge emitting laser 100 in FIGS. 1a and 1b are similar to those employed in FIG. 2 except cavities 110, instead of mesa 310, are employed to allow water vapor to access buried layer 120 and are discussed below.

The use of laterally oxidized $Al_{0.99}Ga_{0.01}As$ buried layer 120 requires minimum etching, only etching of etched cavities 110 to access $Al_{0.99}Ga_{0.01}As$ buried layer 120. Since $Al_{0.99}Ga_{0.01}As$ buried layer 120 is typically less than 1000 Å thick which means that no significant changes need be made to already successful laser designs and there is no significant increase in the time needed for epitaxial growth of the laser structure.

Figure 3B:
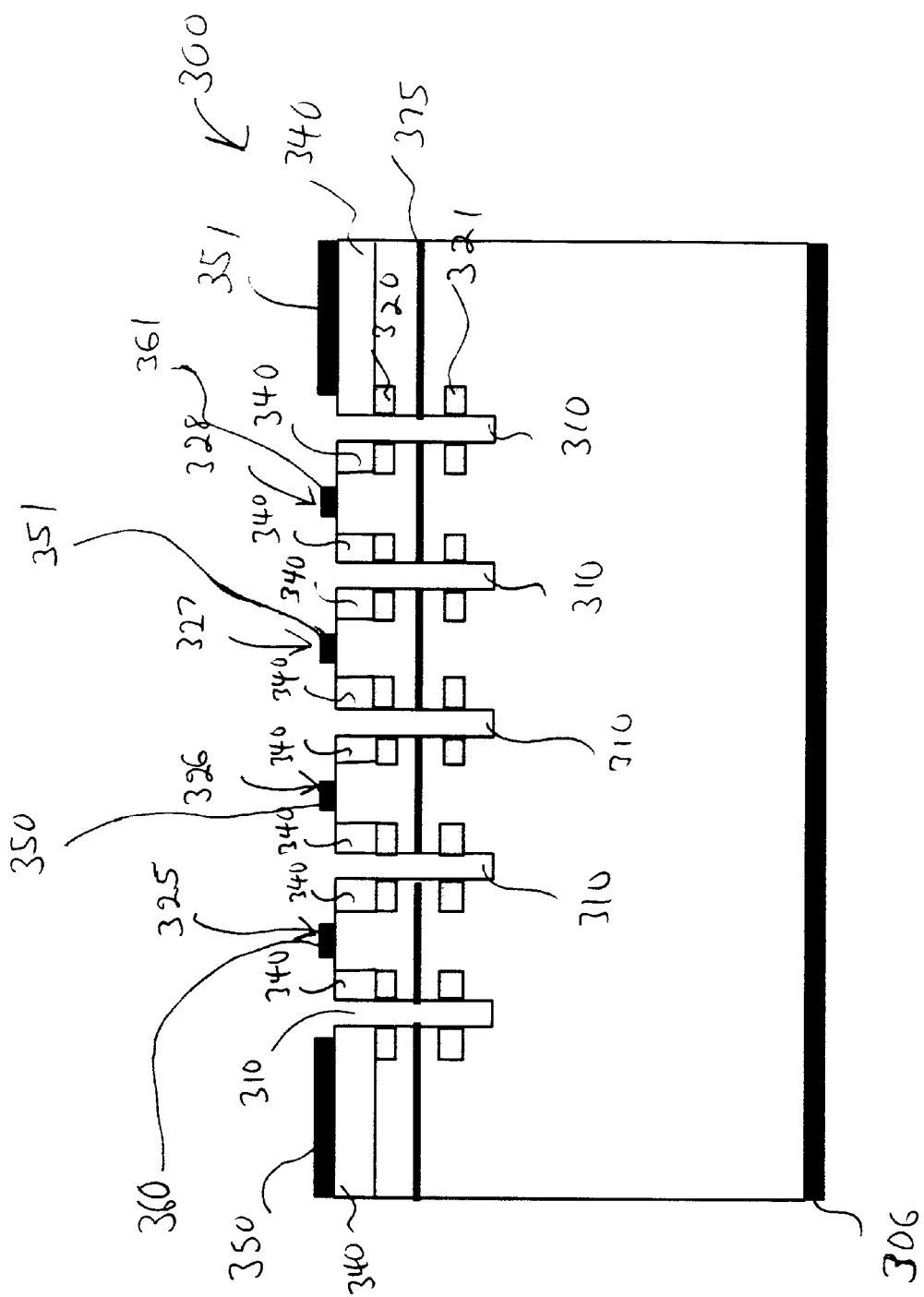
FIG. 3b shows a cross-sectional view of the embodiment in FIG. 3a in accordance with the invention.
Figure 46:
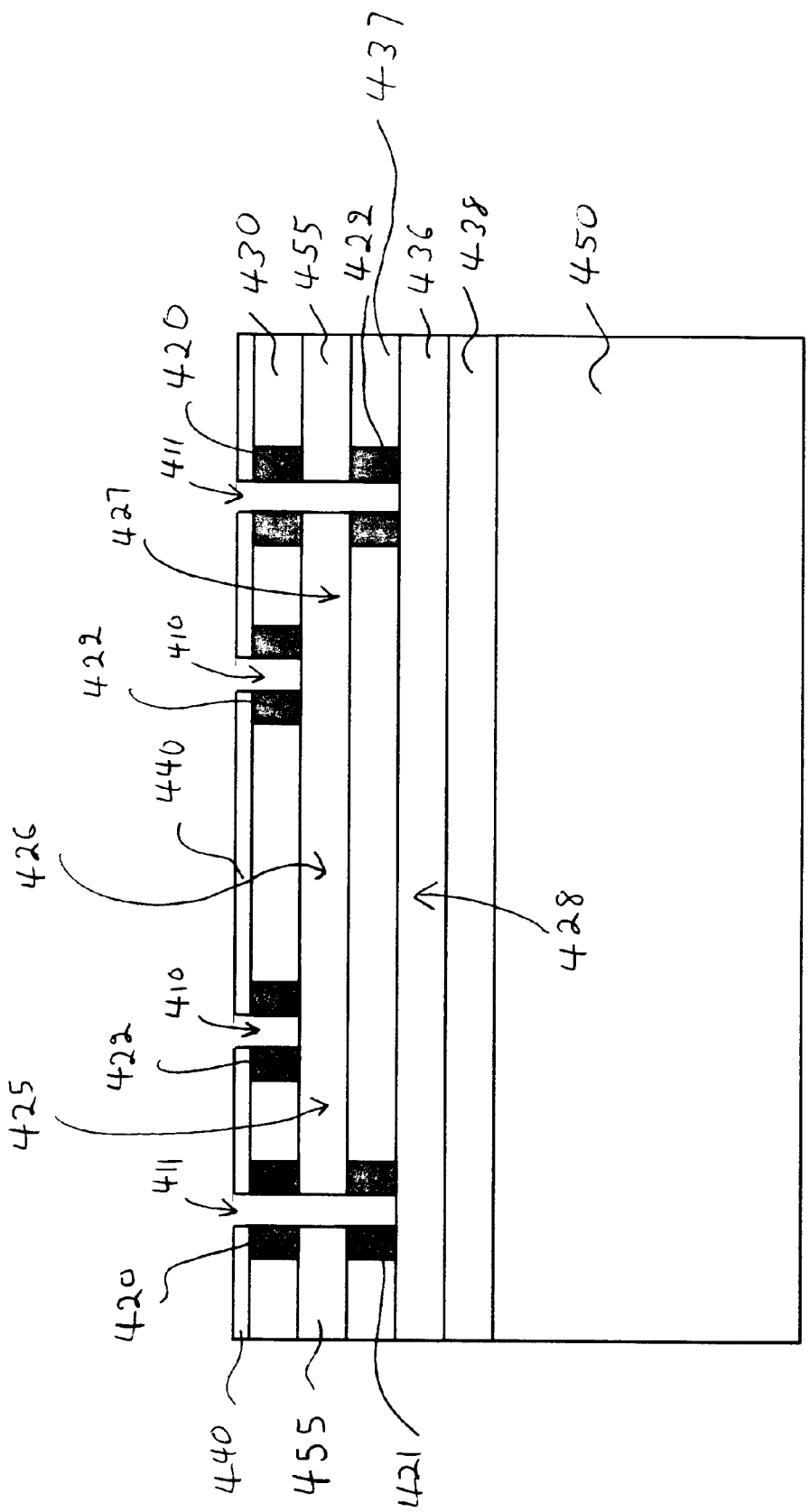

The planar lateral oxidation can be extended to the design of multiple beam edge-emitting lasers. The planar lateral oxidation used for the design of multiple beam edge emitting laser structures in accordance with the invention allows easy electrical routing to achieve close spacing, typically smaller than 20 μm, between individual edge-emitting lasers 325, 326, 327 and 328 as shown in FIG. 3a. FIG. 3a shows a planar view of quad beam structure 300 in accordance with the invention that consists of four closely-spaced independently addressable edge-emitting lasers 325, 326, 327 and 328 while FIG. 3b shows a cross-sectional view of quad beam embodiment 300 along line 3b in FIG. 3a. Electrical isolation between edge emitting lasers 325, 326, 327 and 328 is accomplished through shallow proton implant regions 340 in FIG. 3b. Cavities 310 are present to allow access for performing oxidation of buried layers 320 and 321. Following oxidation, buried layers 320 and 321 provide lateral index guiding for edge-emitting lasers 325, 326, 327 and 328. Metal contact 350 contacts laser 326, metal contact 360 contacts laser 325, metal contact 351 contacts laser 327 and metal contact 361 contacts laser 328 with common metal contact 306 contacting lasers 325, 326, 327 and 328. Active region 375 for edge-emitting lasers 325, 326, 327 and 328 is located between buried layers 320 and 321.

Passive waveguides can be formed using cavities to allow oxidation of buried layers. A region that is bordered by a lower refractive index material is capable of confining light and can be used to guide light from one location to another. Oxidized semiconductors typically have refractive indices that are lower than unoxidized semiconductors. For example, at a typical λ=980 nm, AlAs has a refractive index of about 2.9 and GaAs has a refractive index of about 3.5 whereas oxidized AlAs has a refractive index of 1.5. When two waveguides are close enough to each, typically within about 0.15λ or 147 nm for λ=980 nm, the optical mode in one waveguide couples to the other through evanescent wave interaction.

FIG. 4a is a planar view showing passive waveguide structure 400 in accordance with the invention which functions as a three way beam splitter. Passive waveguide structure 400 consists of four waveguides cores 425, 426, 427 and 428 (see also FIG. 4b which shows a cross-sectional view along line 5 of FIG. 4a). Waveguide core 428 is evanescently coupled to waveguide cores 425, 426 and 427 resulting in a three way split of the signal in waveguide core 428.

Typically, passive waveguide structure 400 is made on GaAs substrate 450. $Al_{0.99}Ga_{0.01}As$ layer 438 and $Al_{0.99}Ga_{0.01}As$ layer 437 are placed above and below GaAs layer 436 to vertically confine light in waveguide core 428 in GaAs layer 436. $Al_{0.99}Ga_{0.01}As$ layer 438 is grown on GaAs substrate 450. GaAs layer 455 is grown on $Al_{0.99}Ga_{0.01}As$ layer 437. $Al_{0.99}Ga_{0.01}As$ layer 430 is then grown over GaAs layer 455 and GaAs capping layer 440 is grown over $Al_{0.99}Ga_{0.01}As$ layer 430. Subsequently, cavities 410 and 411 are etched to provide access to $Al_{0.99}Ga_{0.01}As$ layer 430 and $Al_{0.99}Ga_{0.01}As$ layer 437 for oxidation. Cavities 411 in FIG. 4b are etched down to $Al_{0.99}Ga_{0.01}As$ layer 437 and cavities 410 in FIG. 4b are etched down to $Al_{0.99}Ga_{0.01}As$ layer 430. Side portions 422 of cavities 410 and side portions 420 of cavities 411 in $Al_{0.99}Ga_{0.01}As$ layer 430 are laterally oxidized using water vapor to provide transverse confinement for waveguide cores 425, 426 and 427 in GaAs layer 455. Side portions 421 of cavities 411 are laterally oxidized using water vapor to provide transverse confinement for waveguide core 428. The lateral extent of oxidation for portions 420, 421 and 422 is typically about 4 μm for the embodiment shown in FIG. 4b with etched cavities 411 having a width of about 2 μm.

Figure 5:
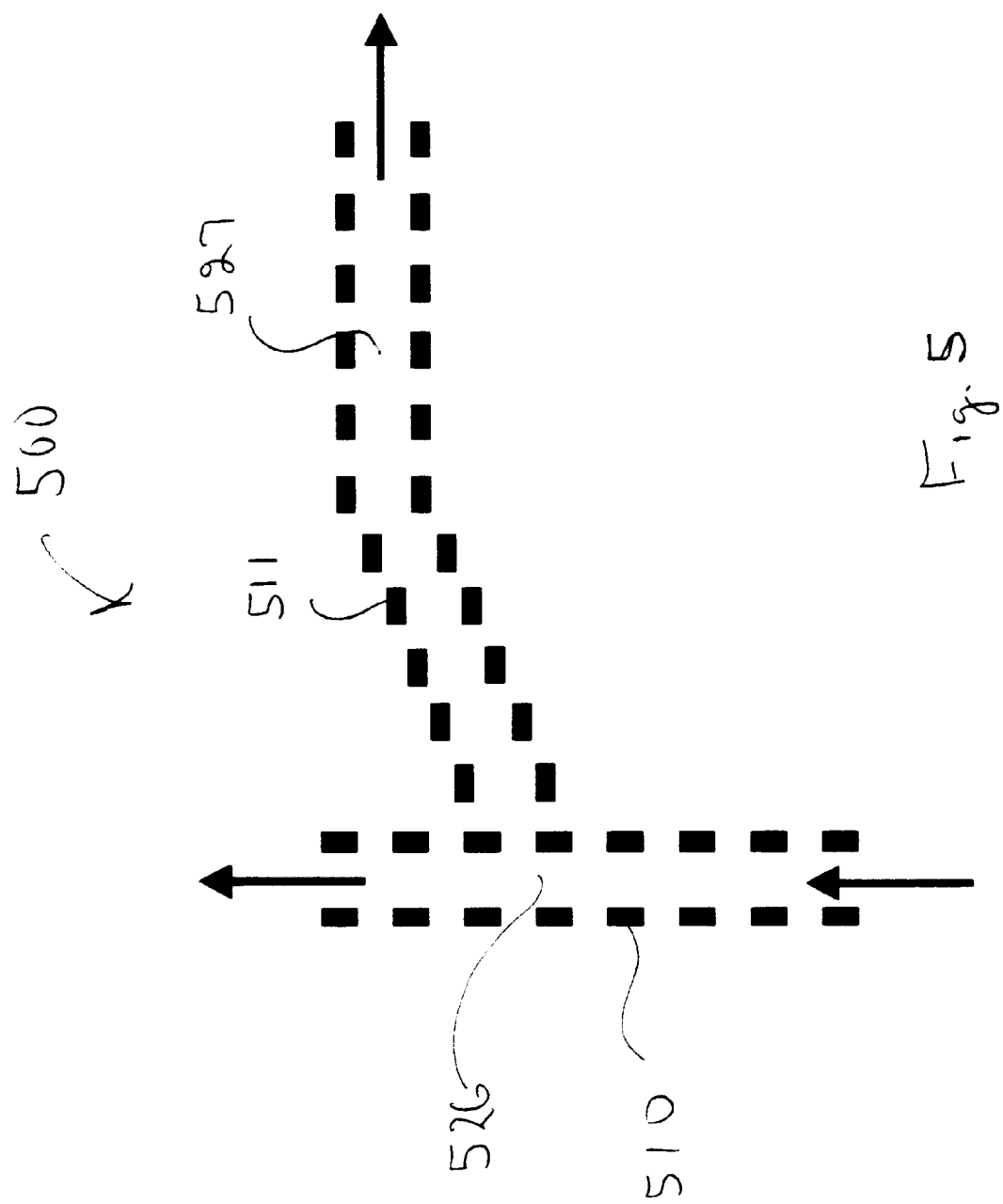
FIG. 5 shows a top view of an embodiment in accordance with the invention.

FIG. 5 shows an embodiment in accordance with the invention which acts as a beam splitter to allow, for example, light to be split off to a photodetector or spectrophotometer. Light enters waveguide core 526 which is defined by cavities 510 with a coupled optical mode being generated by evanescent wave interaction in waveguide core 527 which is defined by cavities 511. Waveguide cores 526 and 527 are vertically stacked and do not lie in the same horizontal plane. Transverse confinement is created by lateral oxidation of the $Al_{0.99}Ga_{0.01}As$ layers (not shown) over the GaAs layer containing waveguide core 526 and the GaAs layer containing waveguide core 527, respectively. Cavities 510 and 511 are etched down to the respective $Al_{0.99}Ga_{0.01}As$ layers (not shown).

Another category of devices includes those where the oxidized layers are used as an anti-reflection coating, a distributed Bragg reflector (DBR), or as a way to form a microlens. Because the difference in refractive index of the oxide and an adjacent semiconductor material can be made much bigger than can be achieved if the layer is not oxidized, a DBR mirror can have a very high reflectivity bandwidth that is relatively insensitive to variations in layer thickness. Also, fewer mirror layers are necessary to achieve a given reflectivity, reducing crystal growth time and cost. For example, at a wavelength of 980 nm the refractive index difference between GaAs and oxidized AlAs is about 2 which is about 3.5 times larger than the refractive index difference between GaAs and AlGaAs alloys. The large refractive index difference between GaAs and AlAs allows a high reflectivity with a wide reflective bandwidth. Since the high reflectivity bandwidth is more than five times wider than for unoxidized materials the layer thickness tolerances necessary to produce high reflectivity at a particular wavelength is also about five times more relaxed and the reflection spectrum is relatively insensitive to variations in layer thickness. Therefore, fewer layers and less stringent thickness tolerances are needed to obtain a given reflectivity. Nineteen pairs of GaAs/AlAs layers are typically needed to achieve a reflectivity of about 99.8% compared to four pairs of GaAs/oxidized AlAs layers.

Figure 6:
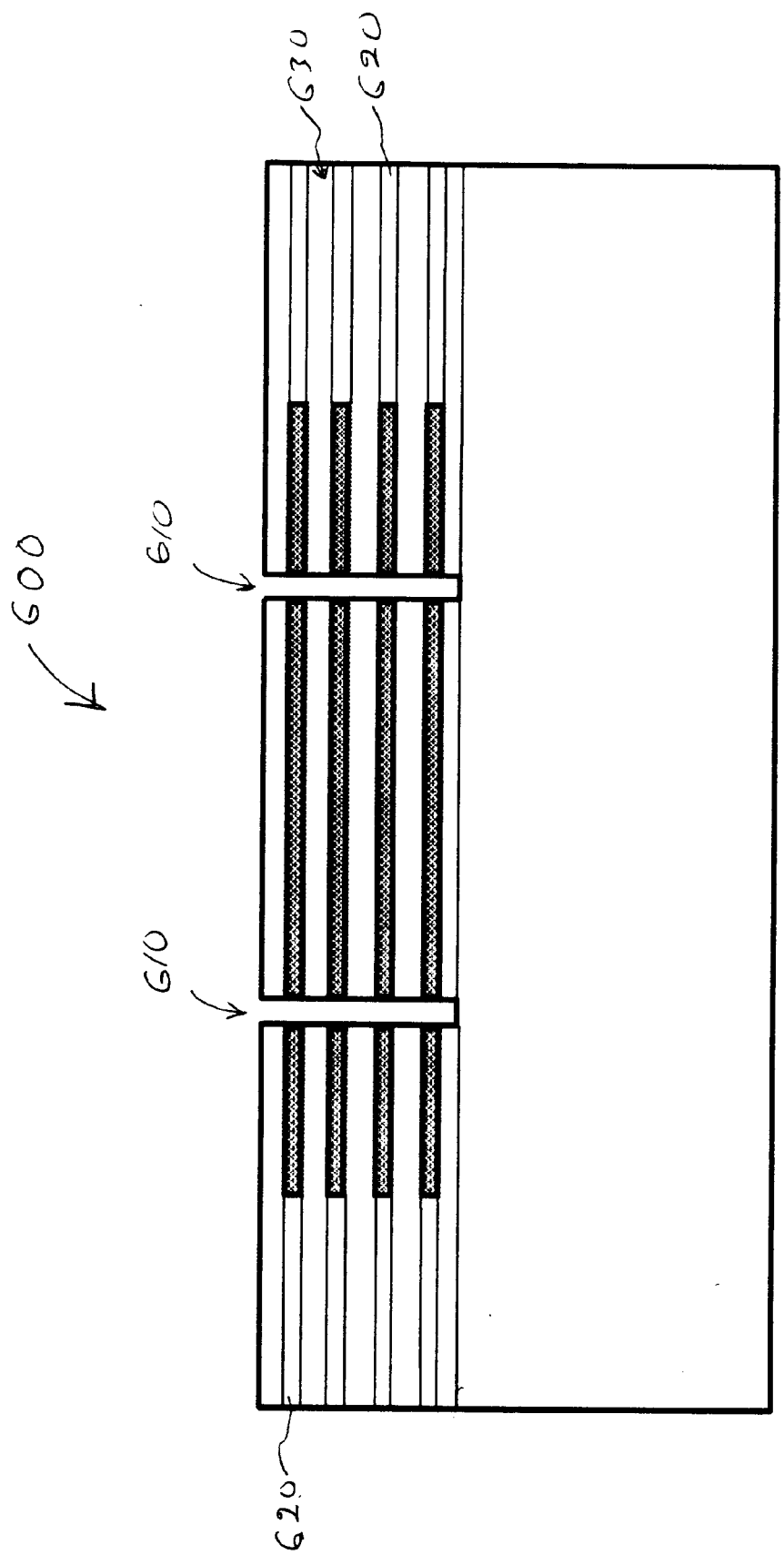
FIG. 6 shows a cross-sectional view of an embodiment in accordance with the invention.

An embodiment in accordance with the invention is shown in FIG. 6 in simplified cross-section. AlAs layers 620 alternate with GaAs layers 630 to form DBR mirror 600. Cavities 610 are used to access AlAs layers 620 for oxidation. The shaded portion of AlAs layers 620 indicates the extent of the oxidation in AlAs layers 620.

Figure 7B:
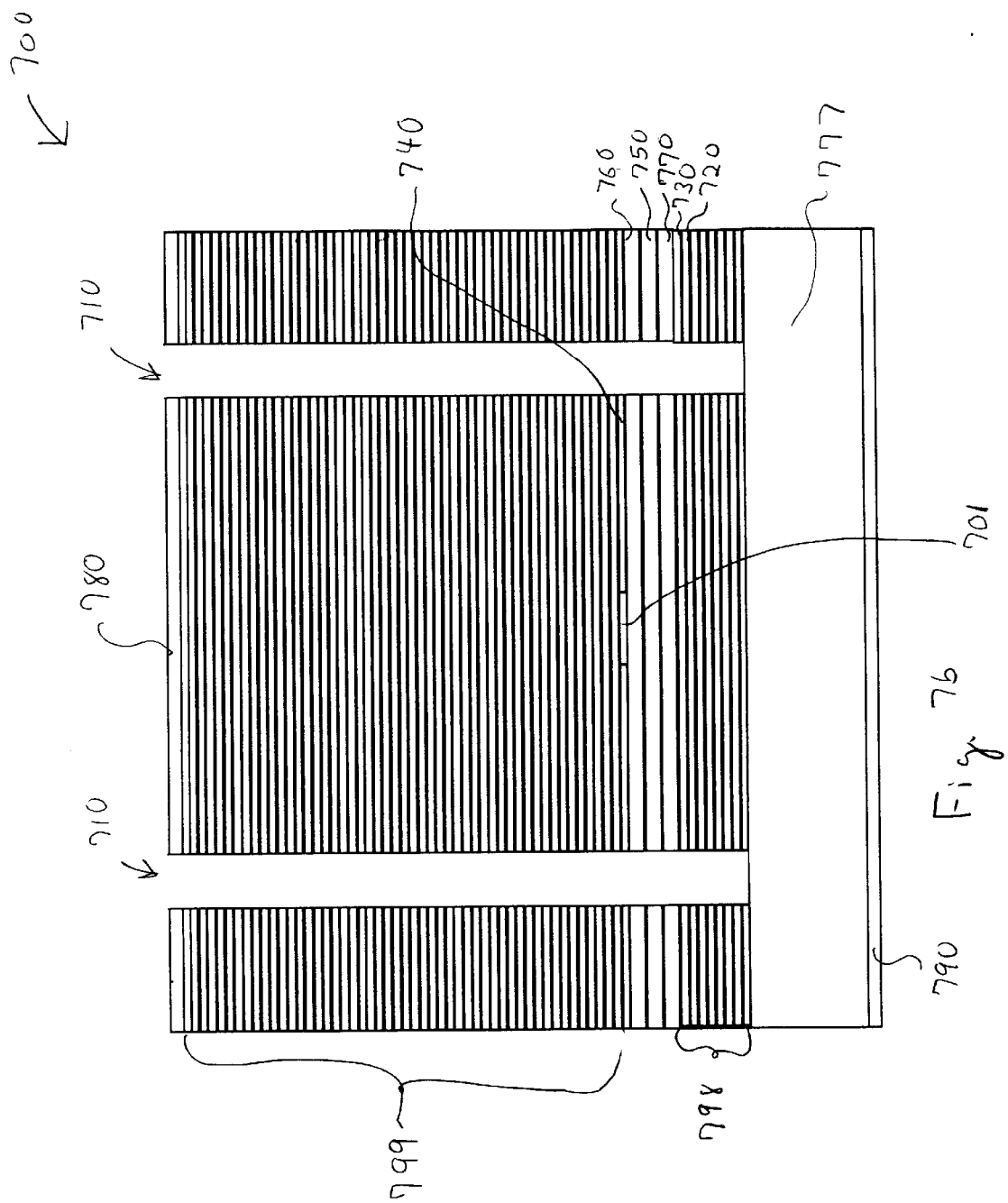
FIG. 7b shows a cross-sectional view of the embodiment in FIG. 7a in accordance with the invention.

In accordance with an embodiment of the invention, high reflectivity DBR mirrors with alternating GaAs layer 730 and oxidized AlAs layer 720 can be used in applications such as vertical cavity surface emitting laser (VCSEL) 700 shown in FIGS. 7a–7c. FIG. 7a shows a top cross-sectional view of VCSEL 700 with etched cavities 710 for allowing oxidation of the various buried high aluminum content layers and oxidized layer 740. FIG. 7b shows a cross-sectional view along line 7b of FIG. 7a while FIG. 7c shows a cross-sectional view along line 7c of FIG. 7a. Upper DBR mirror 799 is typically composed of pseudo-sinusoidally graded 25 layer pairs, typically with $Al_{0.86}Ga_{0.14}As$ layers 798 alternating with $Al_{0.16}Ga_{0.84}As$ layers 797. Upper DBR mirror 799 is silicon doped. Typically, the aluminum content of the AlGaAs layer with a high aluminum content should be sufficiently high to provide for a low refractive index while not being so high as to oxidize easily. The composition of the AlGaAs layer with a low aluminum content should typically have sufficient aluminum so that the low aluminum content layer is non-absorptive at the lasing wavelength. Both $Al_{0.86}Ga_{0.14}As$ layer 798 and $Al_{0.16}Ga_{0.84}As$ layer 797 are typically 0.15 wavelengths thick and the graded AlGaAs material between $Al_{0.86}Ga_{0.14}As$ layer 798 and $Al_{0.16}Ga_{0.84}As$ layer 797 have an aggregate thickness of 0.2 wavelength resulting in a total optical thickness of a half-wavelength per layer pair. An $Al_{0.16}Ga_{0.84}As$ current spreading layer (not shown) and a p GaAs contact layer (not shown) are grown above upper DBR mirror 799.

In accordance with an embodiment of the invention, lower DBR mirror 798 is composed of 4 layer pairs, with GaAs layers 730 alternating with oxidized AlAs layers 720. AlAs layers 720 may contain a small amount of Ga for better structural integrity while still allowing rapid oxidation. Lower DBR mirror 798 is positioned over n-type GaAs substrate 777 typically with an n-type GaAs buffer layer having a 200 nm thickness sandwiched between lower DBR mirror 798 and GaAs substrate 777. For a typical wavelength of interest, $\lambda=980$ nm, the difference in refractive index leads to an interference effect that produces high reflection if the thickness of GaAs layers 730 is about 69.5 nm and the thickness of oxidized AlAs layers 720 is about 163.3 nm. Since AlAs contracts by about ten percent when oxidized, AlAs layers 720 have an initial thickness of about 179.6 nm.

Vertical cavity surface emitting laser (VCSEL) 700 has unoxidized aperture 701 which is typically defined by oxidized $Al_{0.94}Ga_{0.06}As$ layer 740 having a thickness of about a quarter wavelength. Active region 750 typically consists of a one wavelength thick separate confinement heterostructure (SCH). The SCH has four InAlGaAs quantum wells (not shown) and five $Al_{0.35}Ga_{0.42}As$ barrier layers (not shown). Transparent top electrode 780, typically indium tin oxide, and bottom electrode 790 provide electrical contacts. Current is injected through epitaxially grown upper DBR mirror 799 passing through active region 750 and around lower DBR mirror 798 towards electrode 790. Since DBR mirror 798 contains heavily oxidized aluminum layers, DBR mirror 798 does not form part of the current path. Active region 750 is sandwiched between lower $Al_{0.16}Ga_{0.84}As$ cladding layer 770 and upper $Al_{0.58}Ga_{0.32}As$ cladding layer 760. The doping for lower $Al_{0.16}Ga_{0.84}As$ 770 is n-type with a doping level typically in the range of $1\times10^{18}/cm^3$ to $5\times10^{18}/cm^3$ and about a 100 nm thickness. Further details regarding VCSEL structure may be found in U.S. Pat. No. 5,978,408 which is hereby incorporated by reference in its entirety.

Figure 8:
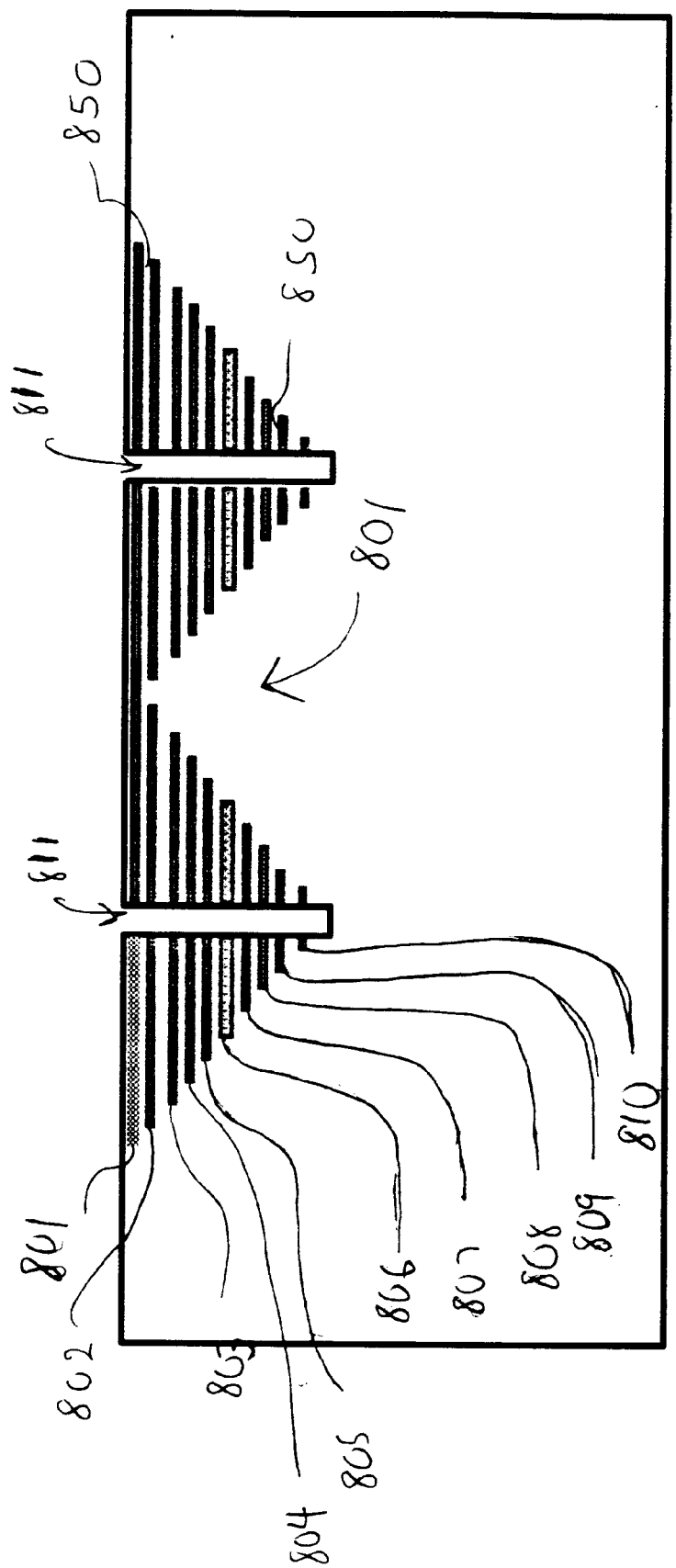
FIG. 8 shows a cross-sectional view of an embodiment in accordance with the invention.

A microlens may be formed by oxidizing a multilayer structure to different lateral extents. In accordance with the invention, FIG. 8 shows microlens 801 fabricated using planar oxidation using etched cavities 811. The different lateral oxidation extent of layers 801, 802, 803, 804, 805, 806, 807, 809 and 810 in FIG. 8 is accomplished by having a different aluminum composition in the respective layers. Thin non-oxidizing layers 850 must be placed between oxidizing layers 801, 802, 803, 804, 805, 806, 807, 809 and 810 to prevent the oxidation process from proceeding in the vertical direction. For example, if microlens 801 has a radius of 25 $\mu$m with a focal length of 10 $\mu$m an embodiment in accordance with the invention is described in Table 1 below. For the embodiment described in Table 1, the aluminum composition in each layer is determined based upon the required oxide length at the same oxidation time. Each layer thickness of $Al_xGa_{1-x}As$ is 1 $\mu$m. Based on the oxidation rate of AlGaAs as a function of aluminum composition at 400° C. the aluminum composition of each layer, the aluminum content of each layer 801, 802, 803, 804, 805, 806, 807, 809 and 810 is selected to make the oxide front form a spherical surface. If a smoother oxide front is desired, layer thickness may be reduced and more layers added. However, it should be noted that non-spherical lenses may also be made using the lateral oxidation technique.

TABLE 1

| Layer | Oxidation length (μm) | x (Al$_x$Ga$_{1-x}$As) |
|---|---|---|
| 801 | 25 | 1 |
| 802 | 18 | 0.985 |
| 803 | 15.2 | 0.977 |
| 804 | 13.1 | 0.973 |
| 805 | 11.4 | 0.967 |
| 806 | 10 | 0.962 |
| 807 | 8.75 | 0.958 |
| 808 | 7.65 | 0.95 |
| 809 | 6.66 | 0.945 |
| 810 | 5.8 | 0.94 |

Figure 9:
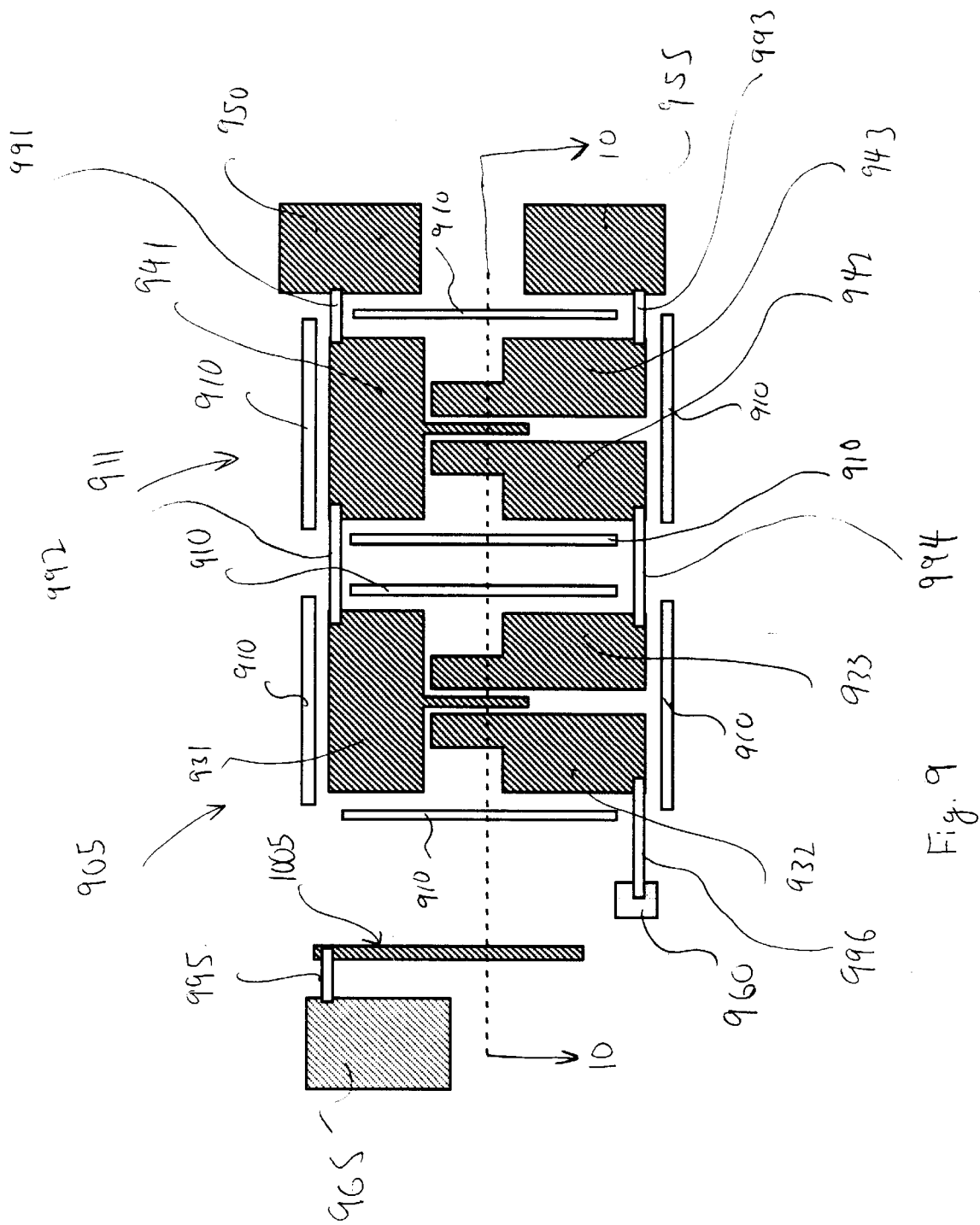
FIG. 9 shows a top view of an embodiment in accordance with the invention.

It is often desirable to integrate various types of electronics and optical devices on the same wafer. The etched cavity method provides an easy means for forming electrical isolation regions between devices in optoelectronics integrated circuits. FIG. 9 shows an embodiment in accordance with the invention consisting of two GaAs metal-semiconductor field effect transistors (MESFET) 905 and 911, integrated with edge emitting semiconductor laser 1005. MESFET transistor 905 consists of gate 931, drain 932 and source 933. MESFET transistor 911 consists of gate 941, drain 942 and source 943. Signal is input on contact pad 950 connecting to gate 941 and gate 931 along interconnect wires 991 and 992, respectively. Source 943 is connected to contact pad 955 by interconnect wire 993 with contact pad 955 going to ground. Interconnect wire 994 connects drain 942 to source 933. P-contact pad 965 is connected to p-contact of edge emitting laser 1005 by interconnect wire 995 and via 960 is connected to drain 932 by interconnect wire 996 and goes to n-contact of edge emitting laser 1005.

Figure 10:
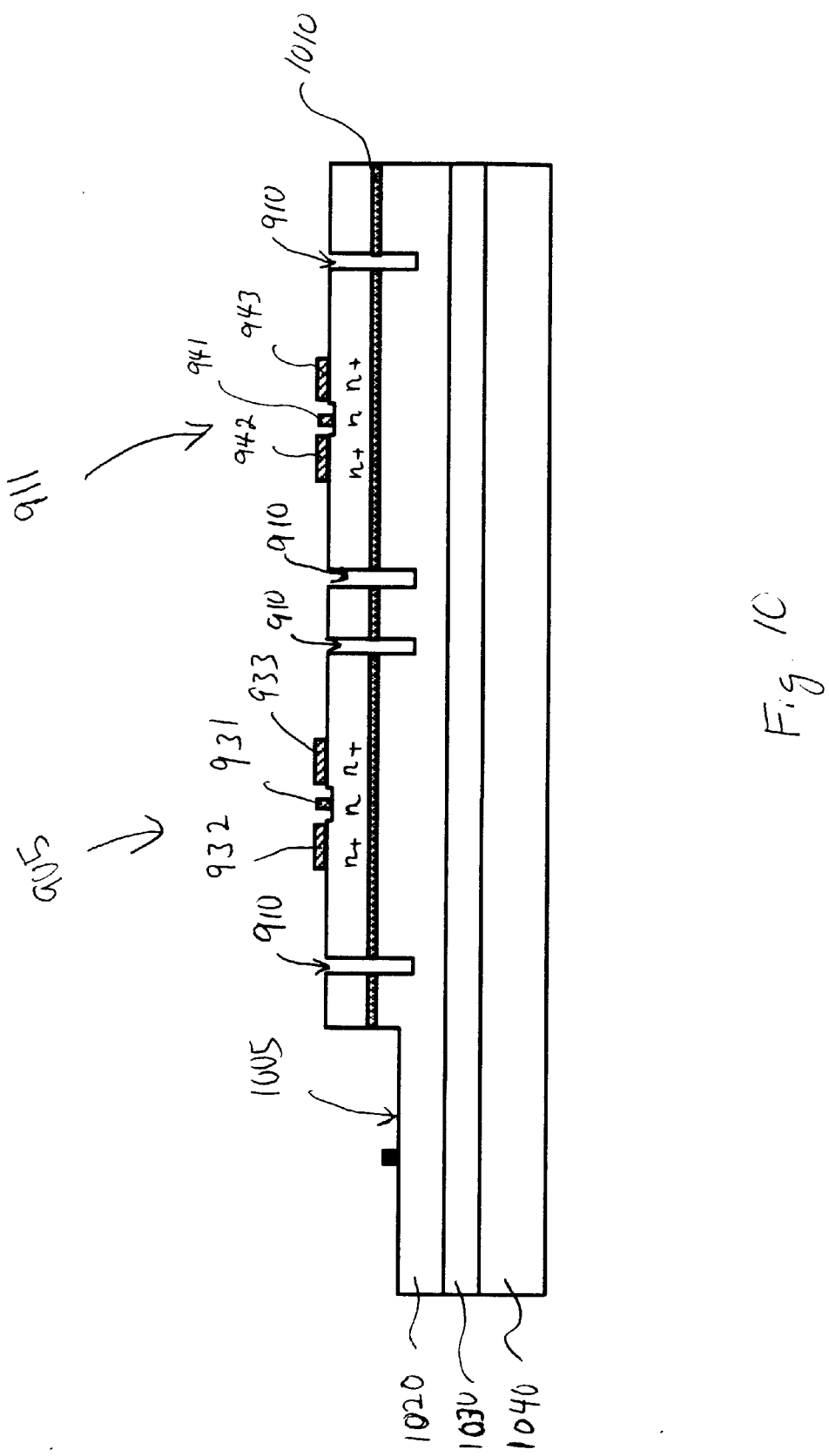
FIG. 10 shows a cross-sectional view of the embodiment in FIG. 9 in accordance with the invention.

Etched cavities 910 provide access to oxidize buried AlAs layer 1010 (see FIG. 10). Buried AlAs layer 1010 functions to electrically isolate both MESFET transistor 905 and MESFET transistor 911 from edge emitting semiconductor laser 1005. To electrically isolate MESFET transistor 905 from MESFET transistor 911 a shallow ion implant is used. A cross section of FIG. 9 running across line 10 in FIG. 9 is shown in FIG. 10. The gate regions of MESFET transistors 905 and 911 are typically doped to the low $10^{17}$/cm$^3$. Higher doping levels at drain 932 and drain 942 regions and source 933 and source 943 regions provide for better ohmic contacts and can be accomplished by ion implantation. P$^+$ layer 1020, intrinsic layer 1030 and n$^+$ layer 1040 form the diode structure for semiconductor edge emitting laser 1005.

Figure 11A:
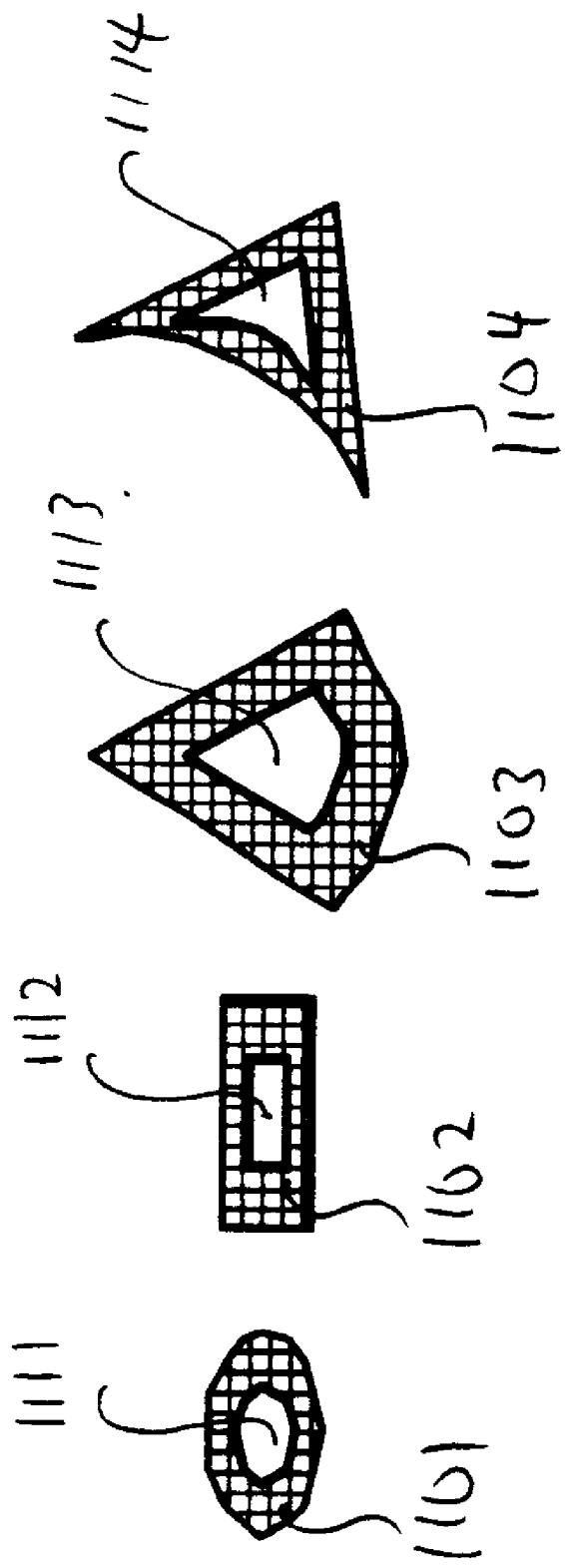
FIG. 11a shows a top view of an embodiment in accordance with the invention.
Figure 116:
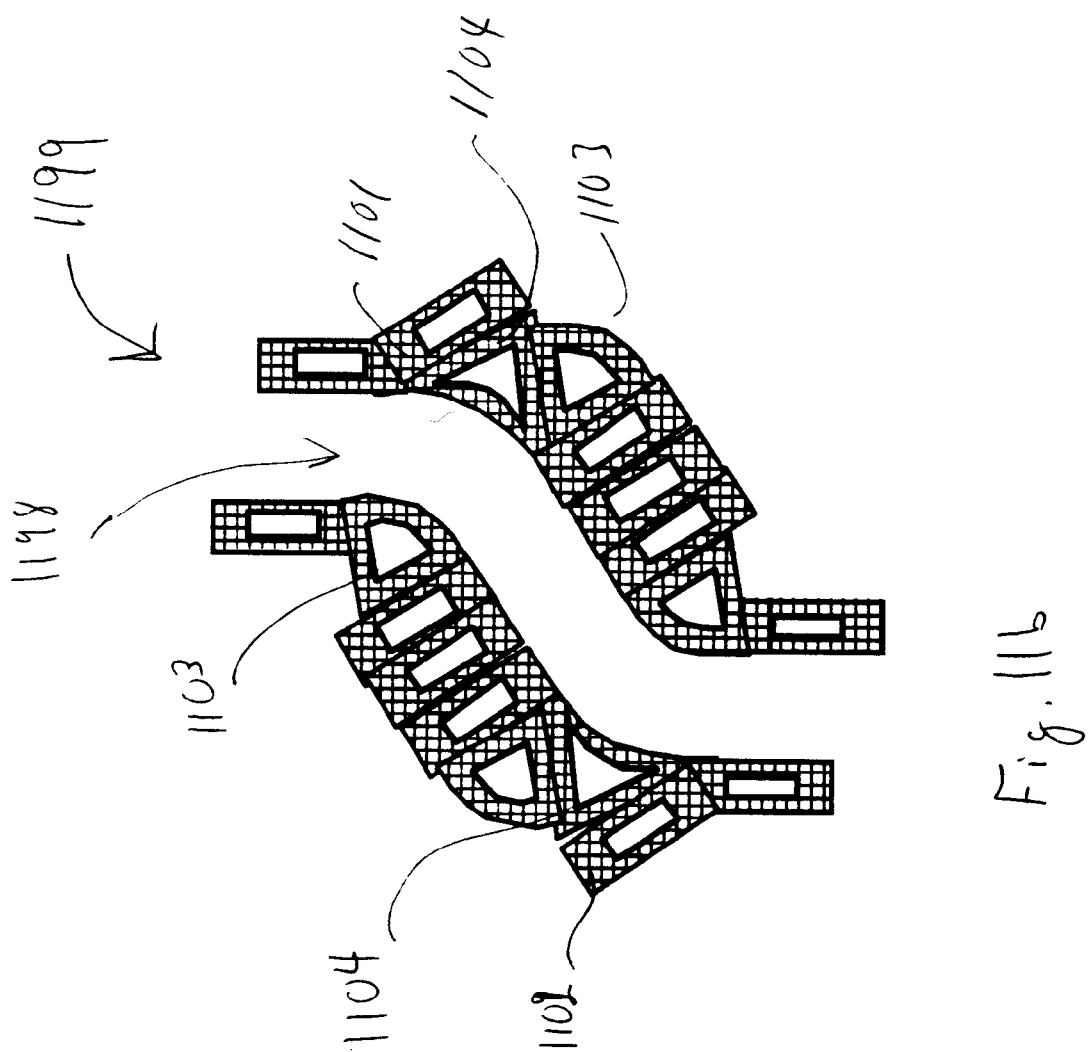

For sufficiently short oxidation extents on the order of 5 μm, the shape of the oxidation fronts follows that of the shape of the etched cavities. FIG. 11a shows possible oxidation front shapes 1101, 1102, 1103, 1104 and corresponding shaped cavities 1111, 1112, 1113, 1114, respectively. Cavities 1111–1114 are patterned, typically in photoresist, and then etched. Subsequently, cavities 1111–1114 are exposed to water vapor in accordance with the invention to make oxidation front shapes 1101–1104 in a buried AlGaAs layer. Oxidation front shapes 1102, 1103 and 1104 concatenated together in FIG. to form oxidation front pattern 1199 which defines curved waveguide 1198. Oxidation front pattern 1199 is created by aligning cavities 1112–1114 so that the oxidation front shapes 1102–1104 emanating from cavities 1112–1114 meet to form a native oxide defined path which is curved waveguide 1198. Curved waveguides have applications to active devices such as ring lasers and integrated optical devices such as Mach-Zehnder modulators.

Figure 13B:
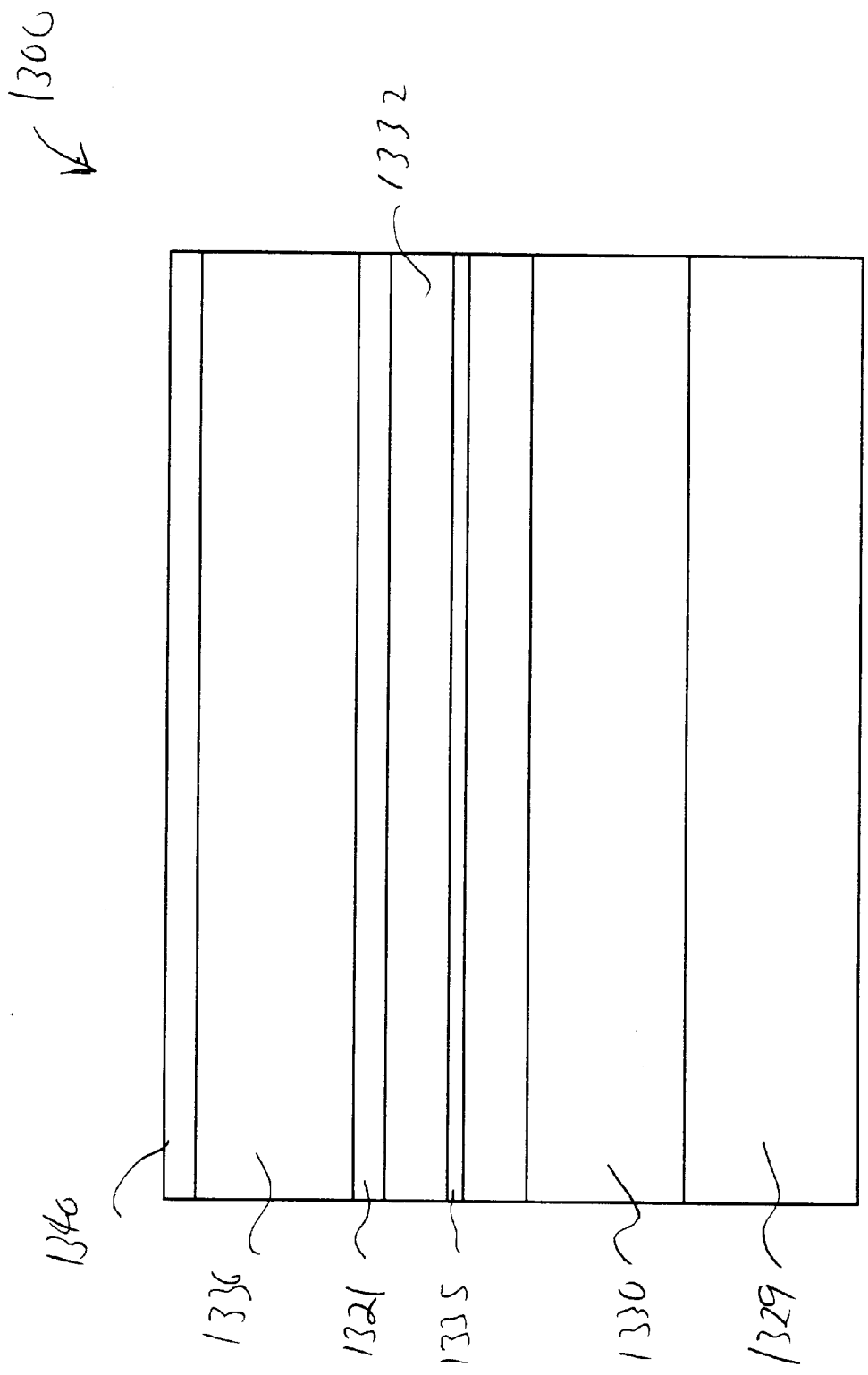
FIG. 13b shows a cross-sectional view of the embodiment in FIG. 13a in accordance with the invention.

FIG. 13a shows distributed feedback (DFB) laser structure 1300 in accordance with the invention where Al$_{0.98}$Ga$_{0.02}$As buried layer 1320 is accessed through etched cavities 1321 for oxidation. The periodic wave-like shape of oxidation fronts 1325 shown in FIG. 13 translates into a periodic refractive index variation. The periodic refractive index variation when designed so that the periodicity is an integral multiple of a half wavelength, provides a distributed feedback mechanism for laser action. For example, for a refractive index of 3.5 for AlGaAs buried layer 1320 which is typical for AlGaAs and a wavelength of 820 nm for DFB laser 1300, the grating period for the oxidation fronts needs to be about 117 nm. FIG. 13b shows the layer structure for DFB laser 1300. N type Al$_{0.7}$Ga$_{0.3}$As lower cladding layer 1330 is grown on n-GaAs substrate 1329, typically to a thickness of about 1 μm. N type Al$_{0.4}$Ga$_{0.6}$As waveguide layer 1331 is grown to a typical thickness of 0.12 μm above n type Al$_{0.7}$Ga$_{0.3}$As cladding layer 1330. GaAs quantum well active layer 1335 lies between n type Al$_{0.4}$Ga$_{0.6}$As waveguide layer 1331 and p type Al$_{0.4}$Ga$_{0.6}$As waveguide layer 1332. P type Al$_{0.7}$Ga$_{0.3}$As upper cladding layer 1336 is separated from p type Al$_{0.4}$Ga$_{0.6}$As waveguide layer 1335 by oxidizable p- Al$_{0.98}$Ga$_{0.02}$As buried layer 1320. P-GaAs layer 1340 serves as the capping layer.

Figure 14A:
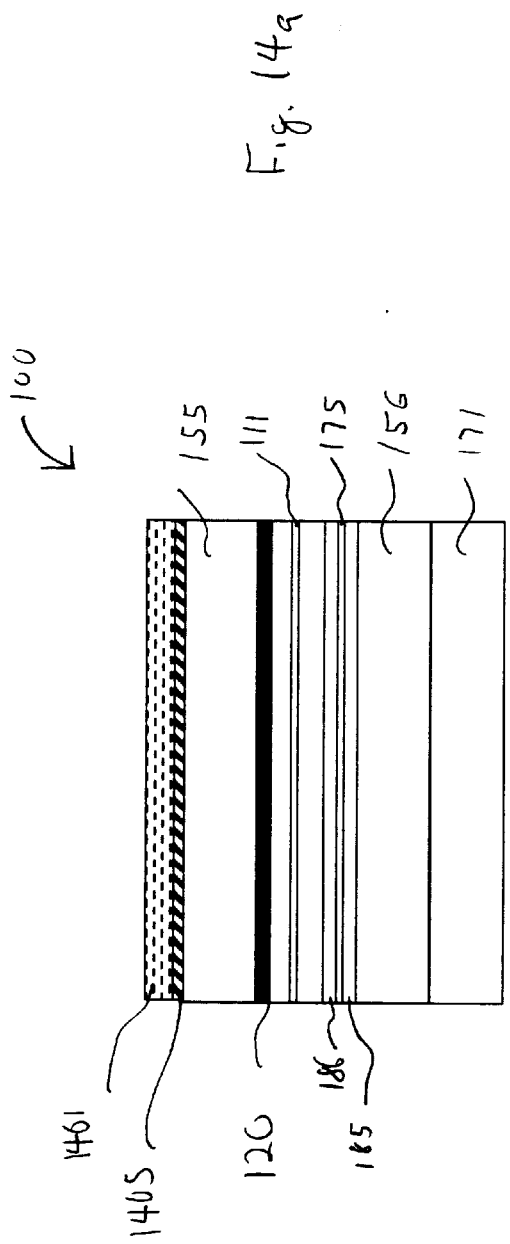
Figure 14B:
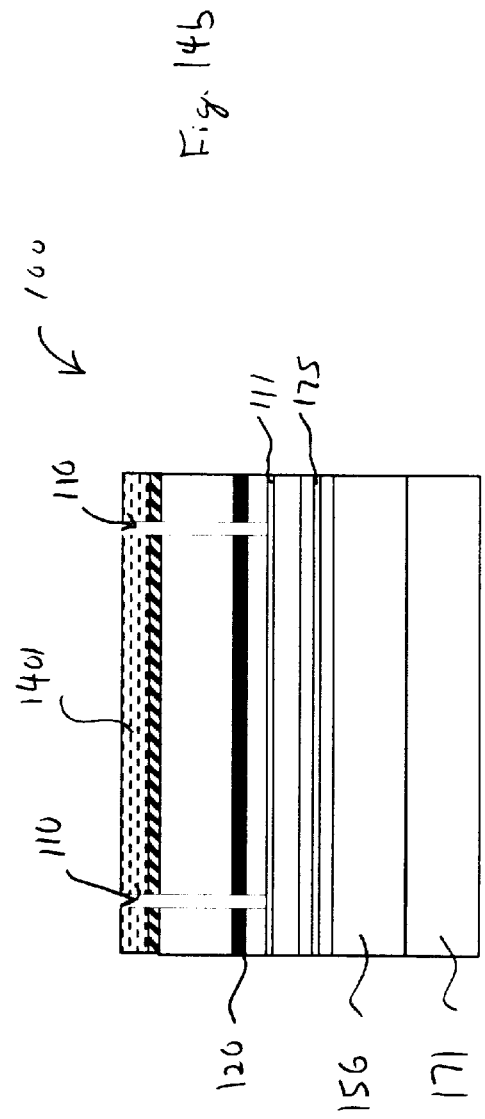
Figure 15A:
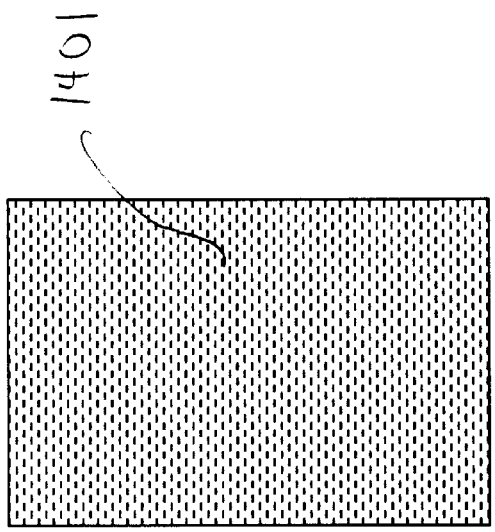

FIGS. 14a–d show a typical fabrication sequence using etched cavities 110 to access buried layer 120 of edge emitting laser structure 100 (see also FIG. 1b) for oxidation in cross-section while FIGS. 15a–15d show a top view. With reference to FIG. 14a and FIG. 15a, after growth of edge emitting laser structure 100, SiO$_2$ layer 1405 is deposited on p type Al$_{0.5}$In$_{0.5}$P cladding layer 155 by chemical vapor deposition (CVD), plasma enhanced CVD or evaporation. SiO$_2$ layer 1405 is followed by deposition of photoresist layer 1401.

Figure 15B:
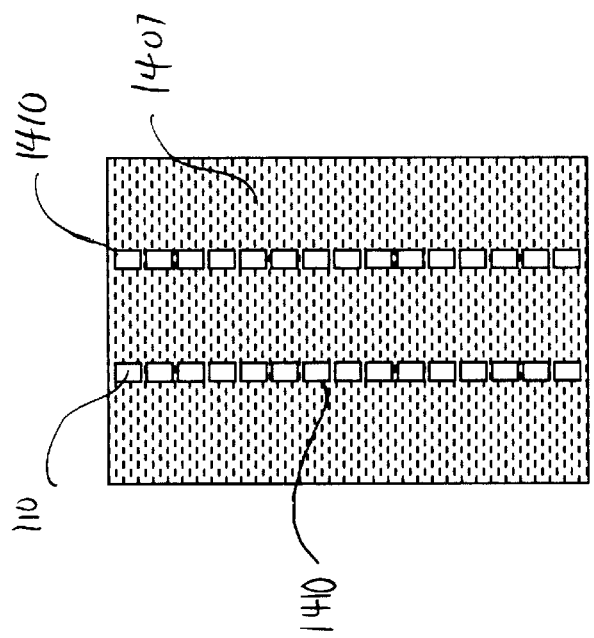

With reference to FIG. 14b and FIG. 15b, photoresist layer 1401 is patterned into perforations 1410 which define the size and position of etched cavities 110. Etched cavities 110 are etched through SiO$_2$ layer 1405 by chemical or dry etching processes down to p type Al$_{0.5}$In$_{0.5}$P cladding layer 155. P type Al$_{0.5}$In$_{0.5}$P cladding layer 155 and underlying semiconductor layers are etched by dry etching such as reactive ion etching (RIE) or chemically assisted ion beam etching (CAIBE) typically down to GaInP etch stop layer 111. For example, etched cavities 110 in GaAs based edge emitting laser structure 100 can be dry etched using chlorine-based reactive ion etching or chemically assisted ion beam etching.

In the case of AlGaAs alloys, the cavities can be etched using either dry or wet etching techniques. Details regarding layer oxidation may be found in H. Nickel, "A detailed experimental study of the wet oxidation kinetics of AlxGa1-xAs layers, J. Appl. Phys., vol. 78 (8), p. 5201,1995 and J. H. Kim et. al., "Lateral wet oxidation of AlxGa1-xAs-GaAs depending on its structures, Appl. Phys. Lett., vol. 69 (22), p. 3357,1996 which are hereby incorporated in their entirety.

An example of dry etching uses a Chemically Assisted Ion Beam Etcher (CAIBE) with a gas mixture consisting of 8 SCCM Cl$_2$, 2SCCM BCL$_3$ and 5 SCCM Ar using a Technics Plasma RIBE ECR 3608. The gas mixture is activated in electron cyclotron resonance (ECR) with 350 watts of microwave power and 1200 gauss of magnetic field. The activated gas is accelerated toward the sample at 550 V and neutralized by an electron emitter at 28% duty cycle. The sample is heated to 100° C. The etch rate depends on cavity size and is about 1,000 Å per minute for a circular cavity with 2 μm diameter.

The cavity etch can also be performed using other dry etching tools such as Reactive Ion Etching (RIE)using a PlasmaQuest ECR reactor. An example of RIE etching uses an ECR-activated mixture of 13.5 SCCM Ar, 1 SCCM $Cl_2$, and 10 SCCM $BCL_3$ with a microwave power of 400 watts and RF power of 33 watts. The etch chamber pressure is controlled to 2.1 torr and the sample temperature is set to 4° C. The etch rate also depends on cavity size and is about 730 Å per minute for 2 □m diameter circular patterns and 1,300 Å per minute for cavities larger than 10 □m in diameter. The RIE machine is PlasmaQuest ECR reactor.

Although small cavities with high aspect ratios are difficult to make using wet etching, opening large cavities by wet chemical means is a viable option. A chemical mixture capable of etching AlGaAs is 1 $H_3PO_4$:1 $H2O_2$:30 $H_2O$, where the numbers refer to volume ratios. Mixing the chemicals in other proportions is also possible. Moreover, other chemicals such as $HCl/H_2O_2$ and $H_2SO_4/H_2O_2$ can be used.

Semiconductors other than AlGaAs will naturally require other etch chemistries. For Indium Phosphide, HCI diluted with $H_3PO_4$ works, while $H_3PO_4/H_2O_2$ diluted with water can be used for InAlGaAs alloys. For InGaAsP alloys, $H_2SO_4/H_2O_2$ diluted with water is ideal. CAIBE and RIE dry etching using chlorine-based gas mixtures like those mentioned for AlGaAs can also be used to open cavities in InP-based materials. However, the etch residues are less volatile, so the sample temperatures should normally be set higher than for AlGaAs etching. Etching processes for materials other than AlGaAs and InGaAsP can be developed as needed.

With reference to FIG. 14c and FIG. 15c, photoresist layer 1401 is stripped and $Al_{0.99}Ga_{0.01}As$ buried layer 120 is oxidized in the manner described in U.S. Pat. No. 5,262,360 which is incorporated by reference in its entirety. Edge emitting laser structure 100 is exposed to a saturated water vapor ambient at temperatures exceeding 400° C. $Al_{0.99}Ga_{0.01}As$ buried layer 120 is converted into an amorphous aluminum oxide which also contains gallium and arsenic oxides. $Al_{0.99}Ga_{0.01}As$ buried layer 120 is insulating and has a low refractive index in typically in the range of 1.5 to 1.6. Care should be taken prevent oxidation of stripe 170 of $Al_{0.99}Ga_{0.01}As$ buried layer 120 which defines the waveguide core.

With reference to FIG. 14d and FIG. 15d, $SiO_2$ layer 1405 is removed by dry etching and p-electrode 105 is deposited by evaporation, with edge emitting laser structure 100 tilted at about a 45 degree angle relative to the beam direction of the evaporated metal atoms. Tilting edge emitting laser structure 100 prevents metal from coating the interior surface of etched cavities 110 and creating undesired current paths through edge emitting laser structure 100. Edge emitting laser structure 100 is thinned and n-electrode 106 is deposited on the bottom to form an n-contact.

The same design methodology and fabrication process allows passive straight waveguide structures 400 (see FIG. 4a) and 500 (see FIG. 5) to be fabricated. However, passive straight waveguide structures 400 and 500 have semiconductor layers in waveguide cores 425, 426, 427 and 526, 527, respectively which do not absorb the propagating light. This means that SCH structure 190 (see FIG. 1b) is designed or processed so that the bandgap of SCH structure 190 in passive waveguide structures 400 and 500 is larger than the photon energy of the light to be propagated. This bandgap engineering can be accomplished by, for example, impurity induced layer disordering or migration enhanced epitaxy. The ability to use the same process for making passive waveguide structures 400 and 500 as is used for active devices, such as edge emitting laser structure 100 is important since this allows a single waveguide structure to have active and passive sections. The passive sections can be used as light modulators by applying a bias voltage which effects the absorption properties of the passive sections.

In summary, a method of accessing a buried oxidizable semiconductor layer for lateral oxidation is described. Because wafer planarity is maintained, the method benefits a wide variety of devices that utilize buried oxidized materials for their optical and electrical properties.

As those skilled in the art will appreciate, other modifications, extensions, and changes to the foregoing disclosed embodiments of the present invention are contemplated to be within the scope and spirit of the invention as defined in the following claims.

What is claimed is:

1. A semiconductor structure comprising:

a substrate;

a plurality of semiconductor layers formed on said substrate with a first of said plurality of semiconductor layers being a top layer and with a second of said plurality of semiconductor layers comprising an oxidizable layer; and the oxidizable layer penetrated by at least three holes, said oxidizable layer oxidized from said at least three holes to form a substantially straight oxidized line that is continuous and unbroken by unoxidized regions, said at least three holes arranged to define a non-oxidized continuous and unbroken stripe region bordered by said substantially straight oxidized line.

2. The semiconductor structure of claim 1 further comprising a fourth hole, such that said oxidizable semiconductor layer is penetrated by at least four holes, each hole of said four holes extending from said top layer, said at least four holes to form an approximately straight linear oxidized region to bound a continuous non-oxidized stripe region bordered by said at least four holes.

3. A semiconductor structure comprising:

a substrate;

a plurality of semiconductor layers formed on said substrate with a first of said plurality of semiconductor layers being a top layer and with a second of said plurality of semiconductor layers comprising an oxidizable layer; and an oxidizable layer penetrated by at least six holes arranged to form a first substantially straight line and a second substantially straight line, together forming not more than two approximately parallel lines, each hole of said six holes extending from said top layer, with a corresponding region of said oxidizable layer being oxidized to form an approximation of two parallel unbroken oxidized lines, the two parallel unbroken oxidized lines define a non-oxidized unbroken continuous stripe region bounded by said approximation of two approximately parallel oxidized lines.

4. The semiconductor structure of claim 3 wherein a first line of said two approximately parallel lines includes at least four holes arranged in a line.

5. The semiconductor structure of claim 4 wherein a second line of said two approximately parallel lines includes at least four holes arranged in a line.

6. The semiconductor structure of claim 3 wherein said non-oxidized unbroken continuous stripe serves as a waveguide.

7. The semiconductor structure of claim 6 wherein the diameter of the oxidized region surrounding each hole is approximately and integral multiple of one half the wavelength of light propagating in the waveguide.

8. The semiconductor structure of claim 6 further including a signal propagating along the waveguide in a direction perpendicular to the axis of each hole in the at least six holes.

9. The semiconductor structure of claim 3 wherein the approximately parallel lines are straight lines.

10. A semiconductor waveguide comprising:

a substrate;

a plurality of semiconductor layers formed on said substrate with a first of said plurality of semiconductor layers being a top layer and with a second of said plurality of semiconductor layers comprising an oxidizable layer; and the oxidizable layer penetrated by at least three holes, each hole of said three holes extending from said top layer, with a corresponding region of said oxidizable layer being oxidized to form an approximation of a substantially straight unbroken oxidized line, the least three holes arranged in a line to define a non-oxidized unbroken continuous stripe region bordered, by, said approximation of a substantially straight oxidized line, the non-oxidized unbroken continuous stripe serving as a waveguide to transmit a signal in a direction perpendicular to the axis of each hole in the at least three holes.

11. The semiconductor structure of claim 10 wherein the diameter of the oxidized region surrounding each hole is approximately and integral multiple of one half the wavelength of light propagating in the waveguide.

* * * * *